United States Patent
Hatakeyama et al.

(10) Patent No.: US 7,632,624 B2
(45) Date of Patent: Dec. 15, 2009

(54) PHOTORESIST UNDERCOAT-FORMING MATERIAL AND PATTERNING PROCESS

(75) Inventors: Jun Hatakeyama, Joetsu (JP); Toshihiko Fujii, Joetsu (JP); Takeru Watanabe, Joetsu (JP); Katshiro Kobayashi, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 231 days.

(21) Appl. No.: 11/798,105

(22) Filed: May 10, 2007

(65) Prior Publication Data

US 2007/0275325 A1 Nov. 29, 2007

(30) Foreign Application Priority Data

May 25, 2006 (JP) ............................. 2006-145107

(51) Int. Cl.
G03F 7/004 (2006.01)
G03F 7/30 (2006.01)

(52) U.S. Cl. ................. 430/271.1; 430/270.1; 430/323; 430/326; 528/129; 528/153

(58) Field of Classification Search .............. 430/270.1, 430/271.1, 276.1, 156, 323, 326; 528/129, 528/153

See application file for complete search history.

(56) References Cited

U.S. PATENT DOCUMENTS

| | | | |
|---|---|---|---|
| 3,398,120 A * | 8/1968 | Hindersinn et al. .......... 528/182 |
| 5,942,594 A * | 8/1999 | Nakae et al. ................. 528/196 |
| 5,972,560 A | 10/1999 | Kaneko et al. |
| 6,042,989 A | 3/2000 | Schaedeli et al. |
| 6,420,088 B1 | 7/2002 | Angelopoulos et al. |
| 6,506,497 B1 | 1/2003 | Kennedy et al. |
| 6,623,909 B2 | 9/2003 | Hatakeyama et al. |
| 6,730,453 B2 | 5/2004 | Nakashima et al. |

(Continued)

FOREIGN PATENT DOCUMENTS

EP 0 614 769 * 9/1994

(Continued)

OTHER PUBLICATIONS

W. Brunsvold et al.; "Evaluation of a Deep UV Bilayer Resist for Sub-Half Micron Lithography", SPIE vol. 1925 (1993), p. 377.

(Continued)

Primary Examiner—Sin J. Lee
Assistant Examiner—Anca Eoff
(74) Attorney, Agent, or Firm—Westerman, Hattori, Daniels & Adrian, LLP

(57) ABSTRACT

A material comprising a specific bisphenol compound of formula (1) is useful in forming a photoresist undercoat wherein $R^1$ and $R^2$ are H, alkyl, aryl or alkenyl, $R^3$ and $R^4$ are H, alkyl, alkenyl, aryl, acetal, acyl or glycidyl, $R^5$ and $R^6$ are alkyl having a ring structure, or $R^5$ and $R^6$ bond together to form a ring. The undercoat-forming material has an extinction coefficient sufficient to provide an antireflective effect at a thickness of at least 200 nm, and a high etching resistance as demonstrated by slow etching rates with $CF_4/CHF_3$ and $Cl_2/BCl_3$ gases for substrate processing.

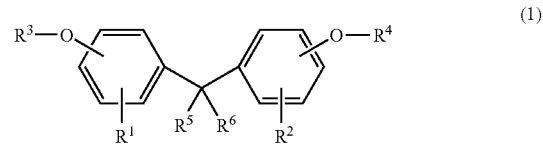

(1)

7 Claims, 6 Drawing Sheets

U.S. PATENT DOCUMENTS

| | | | |
|---|---|---|---|
| 6,852,791 | B2 | 2/2005 | Kawaguchi et al. |
| 7,358,025 | B2 * | 4/2008 | Hatakeyama ............... 430/156 |
| 2006/0204891 | A1 * | 9/2006 | Hatakeyama ............ 430/270.1 |
| 2006/0288263 | A1 | 12/2006 | Nakamura et al. |

FOREIGN PATENT DOCUMENTS

| | | |
|---|---|---|
| JP | 6-118651 A | 4/1994 |
| JP | 9-110938 A | 4/1997 |
| JP | 10-324748 A | 12/1998 |
| JP | 11-302382 A | 11/1999 |
| JP | 2001-40293 A | 2/2001 |
| JP | 2002-14474 A | 1/2002 |
| JP | 2002-55456 A | 2/2002 |
| JP | 2002-214777 A | 7/2002 |
| JP | 2004-177666 A | 6/2004 |

OTHER PUBLICATIONS

J. Hatakeyama et al., "Investigation of Discrimination Enhancement in Polysilesquioxane Based Positive Resist for ArF Lithography"; SPIE vol. 333 (1998), p. 62.

Ulrich Schaedeli et al.; "Evaluation of Materials for 193-nm Lithography"; Journal of Photopolymer Science and Technology, vol. 9, No. 3(1996), pp. 435-446.

Ranee Kwong et al.; "IBM 193nm Bilayer Resist: Materials, Lithographic Performance and Optimization"; SPIE vol. 4345, p. 50 (2001).

J.M.Moran et al.; "High Resolution, steep profile resist patterns"; J. Vac. Sci. Technol., 16(6), Nov./Dec. 1979.

Tom Lynch et al.; "Properties and Performance of Near UV Reflectivity Control Layers"; SPIE vol. 2195, pp. 225-229 (1994).

* cited by examiner

SUBSTRATE REFLECTANCE
UNDERCOAT LAYER n=1.0-2.0, VARYING k=0.3

**SUBSTRATE REFLECTANCE
INTERMEDIATE LAYER n=1.5, VARYING k**

□ 0-1   ▧ 1-2   ▨ 2-3   ▩ 3-4   ■ 4-5   SUBSTRATE REFLECTANCE (%)

**SUBSTRATE REFLECTANCE
INTERMEDIATE LAYER n=1.5, k=0.1
UNDERCOAT LAYER n=1.5, k=0.2**

□ 0-1   ▧ 1-2   ▨ 2-3   ▩ 3-4   ■ 4-5   SUBSTRATE REFLECTANCE (%)

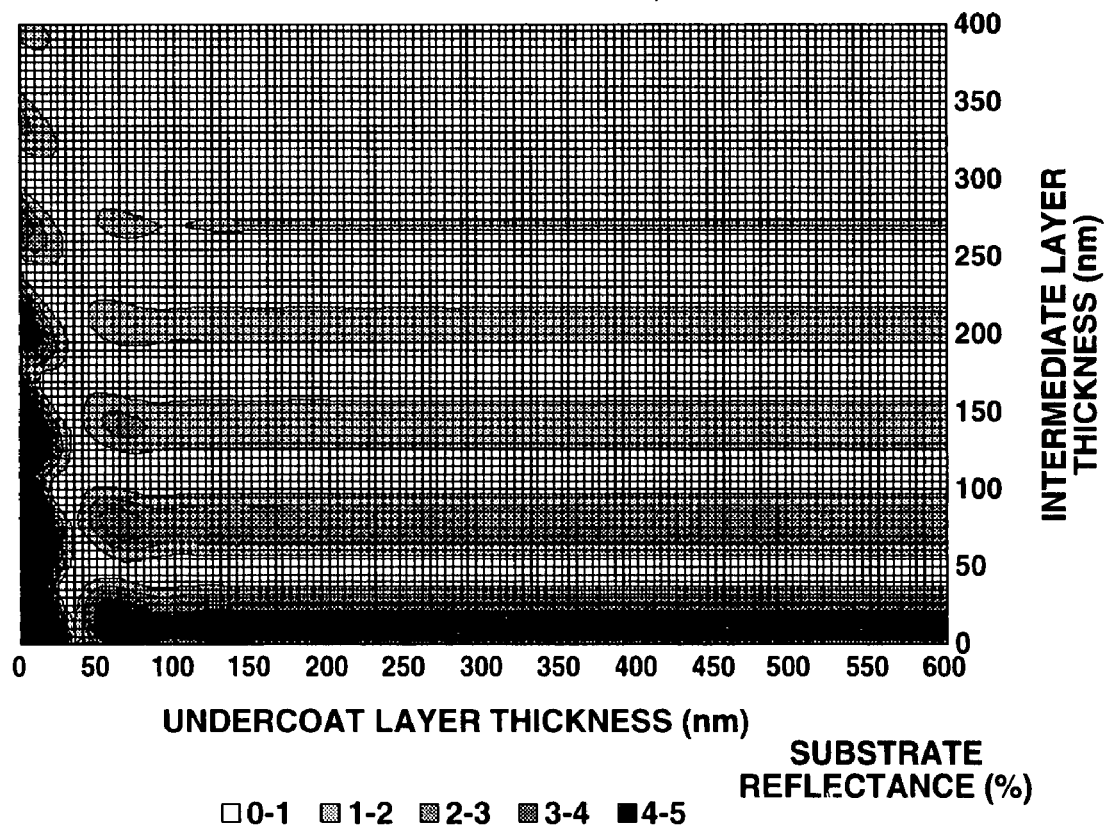

PHOTORESIST UNDERCOAT-FORMING MATERIAL AND PATTERNING PROCESS

CROSS-REFERENCE TO RELATED APPLICATION

This non-provisional application claims priority under 35 U.S.C. § 119(a) on Patent Application No. 2006-145107 filed in Japan on May 25, 2006, the entire contents of which are hereby incorporated by reference.

TECHNICAL FIELD

This invention relates to an undercoat-forming material useful in the multilayer resist process used in micropatterning for the fabrication of semiconductor devices or the like, and more particularly, to an undercoat-forming material useful in a lithographic process adapted for exposure to KrF excimer laser (248 nm), ArF excimer laser (193 nm), $F_2$ laser (157 nm), $Kr_2$ laser (146 nm), $Ar_2$ laser (126 nm), soft X-ray, electron beam, ion beam or X-ray; and a resist pattern-forming process using the same.

BACKGROUND OF THE INVENTION

While a number of recent efforts are being made to achieve a finer pattern rule in the drive for higher integration and operating speeds in LSI devices, the commonly used light exposure lithography is approaching the essential limit of resolution determined by the light source wavelength.

As the light source used in the lithography for resist pattern formation, g-line (436 nm) or i-line (365 nm) from a mercury lamp has been widely used. One means believed effective for further reducing the feature size is to reduce the wavelength of exposure light. For the mass production process of 64 M-bit DRAM, the exposure light source of i-line (365 nm) was replaced by a KrF excimer laser having a shorter wavelength of 248 nm. However, for the fabrication of DRAM with a degree of integration of 1 G or more requiring a finer patterning technology (processing feature size 0.13 µm or less), a shorter wavelength light source is required. In particular, photolithography using ArF excimer laser light (193 nm) is now under investigation.

On the other hand, it is known in the art that the bilayer resist process is advantageous in forming a high-aspect ratio pattern on a stepped substrate. In order that a bilayer resist film be developable with a common alkaline developer, high molecular weight silicone compounds having hydrophilic groups such as hydroxyl and carboxyl groups must be used.

Among silicone base chemically amplified positive resist compositions, recently proposed were those compositions for KrF excimer laser exposure comprising a base resin in the form of polyhydroxybenzylsilsesquioxane, which is a stable alkali-soluble silicone polymer, in which some phenolic hydroxyl groups are protected with t-BOC groups, in combination with an acid generator (see JP-A 6-118651 and SPIE vol. 1925 (1993), p. 377). For ArF excimer laser exposure, positive resist compositions comprising as a base a silsesquioxane of the type in which cyclohexylcarboxylic acid has substituted thereon an acid labile group were proposed (see JP-A 10-324748, JP-A 11-302382, and SPIE vol. 3333 (1998), p. 62). For $F_2$ laser exposure, positive resist compositions based on a silsesquioxane having hexafluoroisopropanol as a dissolvable group were proposed (see JP-A 2002-55456). The above polymer bears in its backbone a polysilsesquioxane containing a ladder skeleton produced through polycondensation of a trialkoxysilane or trihalosilane.

Silicon-containing (meth)acrylate polymers were proposed as a resist base polymer having silicon pendants on side chains (see JP-A 9-110938, J. Photopolymer Sci. and Technol., Vol. 9, No. 3 (1996), pp. 435-446).

The undercoat layer of the bilayer resist process is formed of a hydrocarbon compound which can be etched with oxygen gas, and must have high etching resistance since it serves as a mask when the underlying substrate is subsequently etched. For oxygen gas etching, the undercoat layer must be formed solely of a silicon atom-free hydrocarbon. To improve the line-width controllability of the upper layer of silicon-containing resist and to minimize the sidewall corrugation and pattern collapse by standing waves, the undercoat layer must also have the function of an antireflective coating. Specifically, the reflectance from the undercoat layer back into the resist film must be reduced to below 1%.

Now, the results of calculation of reflectance at film thickness varying up to the maximum of 500 nm are shown in FIGS. 1 and 2. Assume that the exposure wavelength is 193 nm, and the topcoat resist has an n value of 1.74 and a k value of 0.02. FIG. 1 shows substrate reflectance when the undercoat layer has a fixed k value of 0.3, the n value varies from 1.0 to 2.0 on the ordinate and the film thickness varies from 0 to 500 nm on the abscissa. Assuming that the undercoat layer of the bilayer resist process has a thickness of 300 nm or greater, optimum values at which the reflectance is reduced to or below 1% exist in the refractive index range of 1.6 to 1.9 which is approximate to or slightly higher than that of the topcoat resist.

FIG. 2 shows substrate reflectance when the undercoat layer has a fixed n value of 1.5 and the k value varies from 0.1 to 0.8. In the k value range of 0.24 to 0.15, the reflectance can be reduced to or below 1%. By contrast, the antireflective coating used in the form of a thin film of about 40 nm thick in the single-layer resist process has an optimum k value in the range of 0.4 to 0.5, which differs from the optimum k value of the undercoat layer used with a thickness of 300 nm or greater in the bilayer resist process. For the undercoat layer in the bilayer resist process, an undercoat layer having a lower k value, that is, more transparent is necessary.

As the material for forming an undercoat layer in 193 nm lithography, copolymers of polyhydroxystyrene with acrylates are under study as described in SPIE vol. 4345, p. 50 (2001). Polyhydroxystyrene has a very strong absorption at 193 nm and its k value is as high as around 0.6 by itself. By copolymerizing with an acrylic ester having a k value of almost 0, the k value of the copolymer is adjusted to around 0.25.

However, the resistance of the acrylic polymer to substrate etching is weak as compared with polyhydroxystyrene, and a considerable proportion of the acrylic ester must be copolymerized in order to reduce the k value. As a result, the resistance to substrate etching is considerably reduced. The etching resistance is not only reflected by the etching speed, but also evidenced by the development of surface roughness after etching. Through copolymerization of acrylic ester, the surface roughness after etching is increased to a level of serious concern.

Naphthalene ring is one of rings that have a more transparency at 193 nm and a higher etching resistance than benzene ring. JP-A 2002-14474 proposes an undercoat layer having a naphthalene or anthracene ring. However, since naphthol-copolycondensed novolac resin and polyvinyl naphthalene resin have k values in the range of 0.3 to 0.4, the target transparency corresponding to a k value of 0.1 to 0.3 is not reached, with a further improvement in transparency being necessary. The naphthol-copolycondensed novolac resin and polyvinyl naphthalene resin have low n values at 193 nm, as evidenced by a value of 1.4 for the naphthol-copolycondensed novolac resin and a value of only 1.2 for the polyvinyl naphthalene resin when the inventors measured. JP-A 2001-40293 and JP-A 2002-214777 describe acenaphthylene polymers which have lower n values and higher k values at the wavelength of 193 nm than at 248 nm, both falling outside the target values. There is a need for an undercoat layer having a high n value, a low k value, transparency and high etching resistance.

Also proposed was a tri-layer process of stacking a silicon-free single-layer resist as a topcoat, an intermediate layer containing silicon below the resist, and an organic undercoat below the intermediate layer. See J. Vac. Sci. Technol., 16(6), November/December 1979. Since the single-layer resist generally provides better resolution than the silicon-bearing resist, the tri-layer process permits such a high resolution single-layer resist to be used as an imaging layer for light exposure. A spin-on-glass (SOG) coating is used as the intermediate layer. A number of SOG coatings have been proposed.

In the tri-layer process, the optimum optical constants of the undercoat layer for controlling reflection from the substrate are different from those in the bilayer process. The purpose of minimizing substrate reflection, specifically to a level of 1% or less is the same between the bi- and tri-layer processes. In the bilayer process, only the undercoat layer is endowed with the antireflective effect. In the tri-layer process, either one or both of the intermediate layer and the undercoat layer may be endowed with the antireflective effect.

U.S. Pat. No. 6,506,497 and U.S. Pat. No. 6,420,088 disclose silicon-containing layer materials endowed with antireflective effect. In general, a multi-layer antireflective coating has greater antireflective effect than a single-layer antireflective coating and commercially widely used as an antireflective film for optical articles. A higher antireflective effect is obtainable by imparting an antireflective effect to both an intermediate layer and an undercoat layer. If the silicon-containing intermediate layer in the tri-layer process is endowed with the function of an antireflective coating, the undercoat layer need not necessarily possess the maximum function of an antireflective coating. In the tri-layer process, the undercoat layer is required to have high etching resistance during substrate processing rather than the antireflective coating function. Then a novolac resin having high etching resistance and containing more aromatic groups must be used as the undercoat layer in the tri-layer process.

FIG. 3 illustrates substrate reflectance with a change of the k value of the intermediate layer. It is seen that by setting a k value as low as 0.2 or less and an appropriate thickness to the intermediate layer, a satisfactory antireflective effect as demonstrated by a substrate reflectance of up to 1% is achievable. In general, the antireflective coating must have a k value of 0.2 or greater in order to reduce reflectance to or below 1% at a coating thickness of 100 nm or less (see FIG. 2). In the tri-layer structure wherein the undercoat layer serves to restrain reflection to a certain extent, the intermediate layer may have an optimum k value of less than 0.2.

FIGS. 4 and 5 illustrate changes of reflectance with the varying thickness of the intermediate layer and undercoat layer, when the undercoat layer has a k value of 0.2 and 0.6, respectively. The undercoat layer having a k value of 0.2 assumedly corresponds to the undercoat layer optimized for the bilayer process, and the k value of 0.6 for the undercoat layer is approximate to the k values at 193 nm of novolac and polyhydroxystyrene. The thickness of the undercoat layer varies with the topography of the substrate whereas the thickness of the intermediate layer is kept substantially unchanged so that presumably it can be coated to the predetermined thickness. The undercoat layer with a higher k value (0.6) is effective in reducing reflectance to 1% or less with a thinner film. In the event that the undercoat layer has a k value of 0.2 and a thickness of 250 nm, the intermediate layer must be increased in thickness in order to provide a reflectance of 1% or less. Increasing the thickness of the intermediate layer is not preferable because a greater load is applied to the topcoat resist layer during dry etching of the intermediate layer. To use the undercoat layer in thin film form, it must have not only a high k value, but also greater etching resistance.

In the event the underlying processable film is a low dielectric constant insulating film of porous silica, the positive resist suffers from a footing problem and a poisoning problem that scum is left in the spaces. It is believed that these problems arise because ammonia is adsorbed by the porous silica during the substrate cleaning step using ammonia and then liberated during the resist processing step to neutralize the acid generated in the exposed area of resist. JP-A 2004-177666 proposes to use a polymer having acidic groups for prohibiting the poisoning problem.

SUMMARY OF THE INVENTION

An object of the present invention is to provide an undercoat-forming material useful as an undercoat layer in the bi- or tri-layer resist process, which comprises a specific bisphenol compound having a group of many carbon atoms, has high transparency and better etching resistance than polyhydroxystyrene and cresol novolac resins, and exerts not only a satisfactory antireflective effect, but also an anti-poisoning effect to a porous silica insulating film after substrate cleaning; and a pattern-forming process using the same.

The inventors have found that a specific bisphenol compound having a group of many carbon atoms forms a layer having high transparency and etching resistance and is thus promising as an undercoat layer in the bi- or tri-layer resist technology.

The invention provides a specific bisphenol compound having a group of many carbon atoms which is useful in forming an undercoat layer in the bi- or tri-layer resist process, and more particularly exhibits improved etching resistance and transparency in the lithography using high-energy radiation with wavelength of up to 300 nm, specifically excimer lasers of 248, 193 and 157 nm, soft x-ray of 3-20 nm, electron beam and x-ray; and a material based on a novolac resin produced through condensation of the bisphenol compound. From the material, an undercoat layer exhibiting very high dry etching resistance during substrate processing is obtainable.

The undercoat layer according to the invention is mainly applied to the tri-layer process. When applied to the KrF or ArF laser bilayer process, the undercoat layer having a high value of k produces substantial substrate reflection. However, the substrate reflection can be reduced below 1% if the undercoat is combined with an intermediate layer having an anti-reflective effect.

The undercoat-forming material of the invention can form a film of high denseness which exerts a barrier effect against ammonia gas, preventing the occurrence of poisoning.

In one aspect, the invention provides a photoresist undercoat-forming material comprising a bisphenol compound having the general formula (1), and a photoresist undercoat-forming material comprising a resin comprising recurring units derived by novolac formation of a bisphenol compound, as represented by the general formula (2).

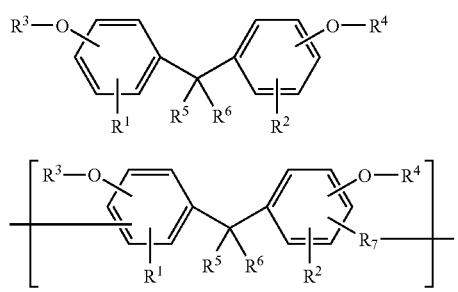

(1)

(2)

Herein $R^1$ and $R^2$ are each independently hydrogen, a straight, branched or cyclic $C_1$-$C_{10}$ alkyl group, $C_6$-$C_{10}$ aryl group or $C_2$-$C_{10}$ alkenyl group; $R^3$ and $R^4$ are each independently hydrogen, a straight, branched or cyclic $C_1$-$C_6$ alkyl group, straight, branched or cyclic $C_2$-$C_6$ alkenyl group, $C_6$-$C_{10}$ aryl group, $C_2$-$C_6$ acetal group, $C_2$-$C_6$ acyl group or glycidyl group; $R^5$ and $R^6$ each are a $C_5$-$C_{30}$ alkyl group having a ring structure, which may have a double bond or be separated by a heteroatom, or $R^5$ and $R^6$ bond together to form a ring with the carbon atom to which they are attached; and $R^7$ is a single bond or straight or branched $C_1$-$C_6$ alkylene group.

The photoresist undercoat-forming material may further comprise an organic solvent, a crosslinker and an acid generator.

In another aspect, the invention provides a patterning process comprising the steps of applying the photoresist undercoat-forming material onto a processable substrate to form an undercoat layer; applying a photoresist composition onto the undercoat layer to form a photoresist layer; exposing the photoresist layer in a predetermined region to radiation; developing the photoresist layer with a developer to form a photoresist pattern; and processing the undercoat layer and the substrate through the patterned photoresist layer as a mask, by means of a dry etching apparatus. In a preferred embodiment, the photoresist composition comprises a silicon atom-containing polymer, and the processing step includes dry etching the undercoat layer through the photoresist layer as a mask with an oxygen-based etchant gas.

In a further aspect, the invention provides a patterning process comprising the steps of applying the photoresist undercoat-forming material onto a processable substrate to form an undercoat layer; applying a silicon atom-containing intermediate layer over the undercoat layer; applying a photoresist composition onto the intermediate layer to form a photoresist layer; exposing the photoresist layer in a predetermined region to radiation; developing the photoresist layer with a developer to form a photoresist pattern; processing the intermediate layer through the patterned photoresist layer as a mask; removing the patterned photoresist layer; and processing the undercoat layer and then the substrate through the processed intermediate layer as a mask, the processing steps using a dry etching apparatus. In a preferred embodiment, the photoresist composition comprises a silicon atom-free polymer, and the step of processing the undercoat layer includes dry etching with an oxygen-based etchant gas.

BENEFITS OF THE INVENTION

The photoresist undercoat-forming material of the invention forms an undercoat layer having such an extinction coefficient that it exerts a satisfactory antireflective effect at a thickness of at least 200 nm, optionally when combined with an intermediate layer having an antireflective effect. The material is more robust than conventional m-cresol novolac resins against halide gas etchants, as judged in terms of a rate of etching with $CF_4/CHF_3$ gas or $Cl_2/BCl_3$ gas used for substrate processing, that is, has high etching resistance. The resist profile after patterning is satisfactory.

BRIEF DESCRIPTION OF THE DRAWINGS

FIG. 5 is a graph plotting the substrate reflectance versus varying thickness of the undercoat layer and intermediate layer in trilayer process when the undercoat layer has a fixed n of 1.5 and a fixed k of 0.6, and the intermediate layer has a fixed n of 1.5 and a fixed k of 0.1.

DESCRIPTION OF THE PREFERRED EMBODIMENTS

Figure 1:
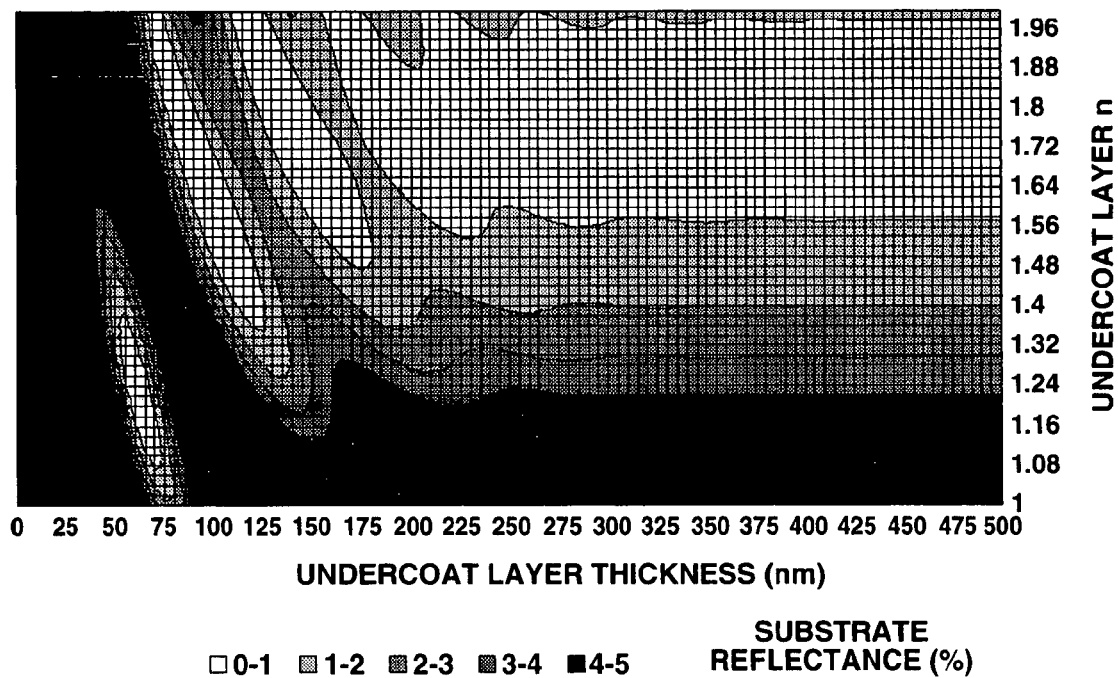
FIG. 1 is a graph plotting the substrate reflectance versus undercoat layer thickness in bilayer process when the k value of the undercoat layer is fixed at 0.3 and the n value varies from 1.0 to 2.0.
Figure 2:
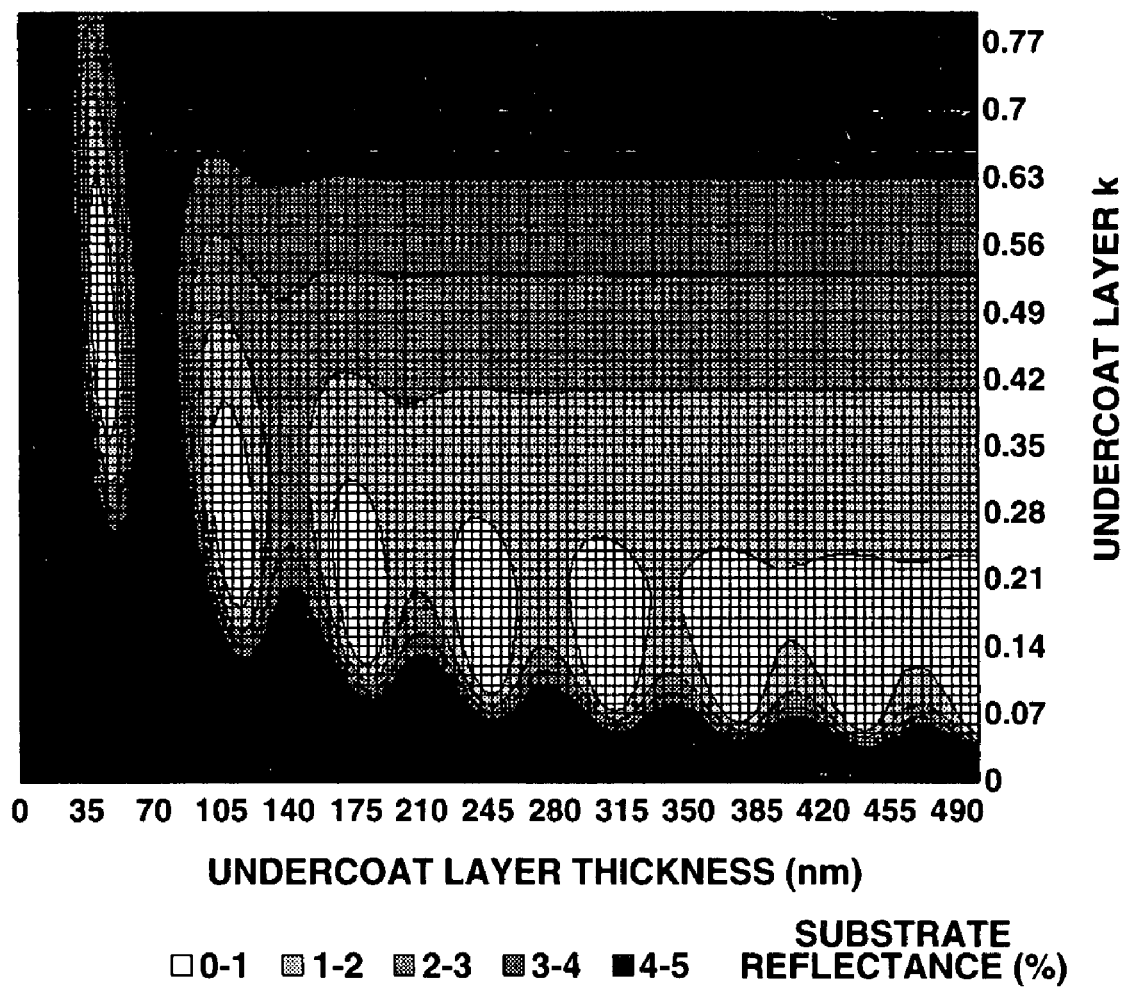
FIG. 2 is a graph plotting the substrate reflectance versus undercoat layer thickness in bilayer process when the n value of the undercoat layer is fixed at 1.5 and the k value varies from 0.1 to 1.0.
Figure 3:
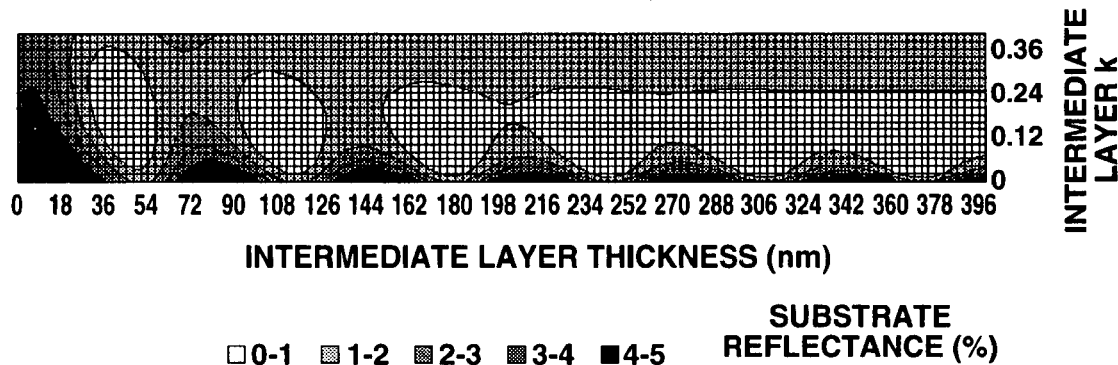
FIG. 3 is a graph plotting the substrate reflectance in trilayer process when the undercoat layer has a fixed n of 1.5, a fixed k of 0.6 and a fixed thickness of 500 nm, and the intermediate layer has a fixed n of 1.5, a k value varying from 0 to 0.3 and a thickness varying from 0 to 400 nm.
Figure 4:
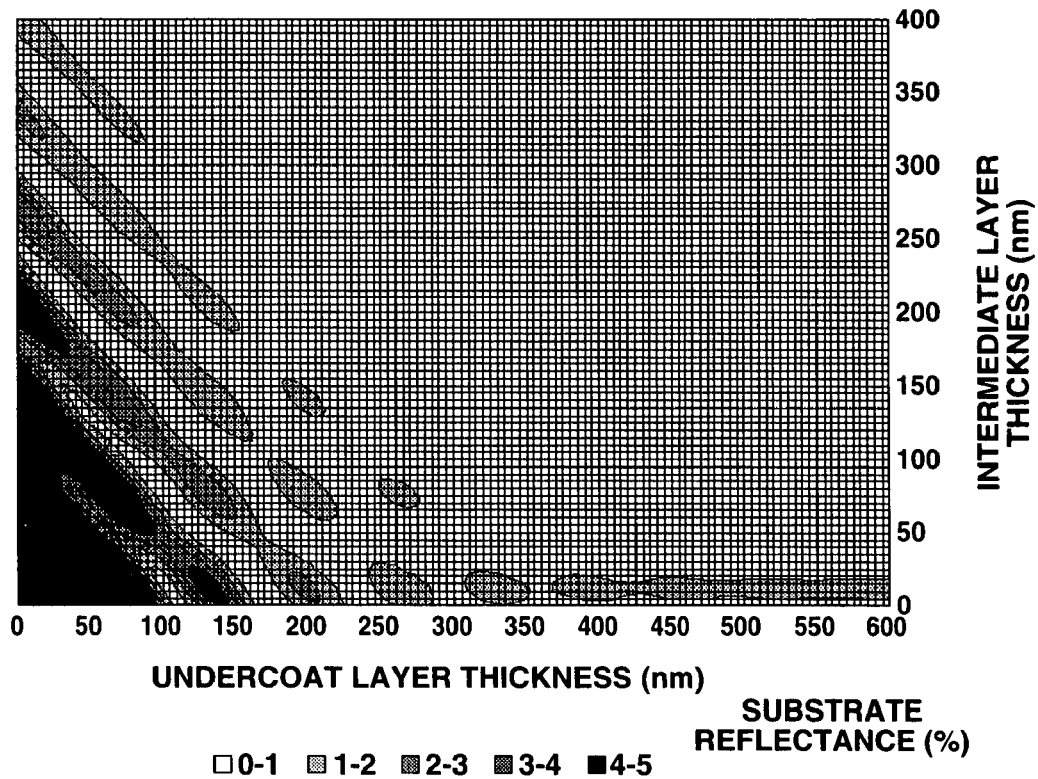
FIG. 4 is a graph plotting the substrate reflectance versus varying thickness of the undercoat layer and intermediate layer in trilayer process when the undercoat layer has a fixed n of 1.5 and a fixed k of 0.2, and the intermediate layer has a fixed n of 1.5 and a fixed k of 0.1.

The singular forms "a", "an" and "the" include plural references unless the context clearly dictates otherwise.

The notation (Cn-Cm) means a group containing from n to m carbon atoms per group.

The term "bisphenol compound" refers to a compound having a bisphenol group.

The patterning process of the invention uses a photoresist undercoat-forming material comprising a bisphenol compound having a group of many carbon atoms represented by the general formula (1) and/or a resin comprising recurring units derived by novolac formation of a bisphenol compound, as represented by the general formula (2). The photoresist undercoat-forming material is applied onto a substrate to form an undercoat layer. A photoresist composition is applied onto the undercoat layer, optionally via an intermediate layer, to form a photoresist layer. The photoresist layer in a predetermined region is exposed to radiation, and developed with a developer to form a photoresist pattern. Using a dry etching apparatus, the undercoat layer and the substrate are processed through the patterned photoresist layer as a mask.

The photoresist undercoat-forming material comprises essentially (A) a specific bisphenol compound having a group of many carbon atoms represented by the general formula (1) and/or a resin comprising recurring units derived by novolac formation of a bisphenol compound as represented by the general formula (2), and optionally and preferably (B) an organic solvent. In addition, (C) a blending polymer, (D) a crosslinker, and (E) an acid generator may be included for the purposes of improving spin coating characteristics, burying of stepped substrates, and film's rigidity and solvent resistance.

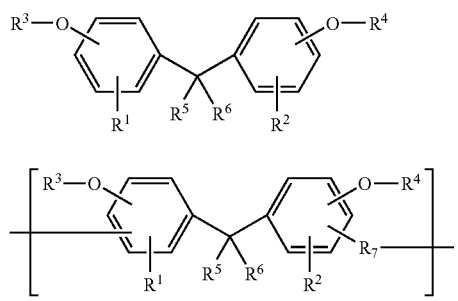

Herein $R^1$ and $R^2$ are each independently hydrogen, a straight, branched or cyclic $C_1$-$C_{10}$ alkyl group, a $C_6$-$C_{10}$ aryl group or a $C_2$-$C_{10}$ alkenyl group. $R^3$ and $R^4$ are each independently hydrogen, a straight, branched or cyclic $C_1$-$C_6$ alkyl group, a straight, branched or cyclic $C_2$-$C_6$ alkenyl group, a $C_6$-$C_{10}$ aryl group, a $C_2$-$C_6$ acetal group, a $C_2$-$C_6$ acyl group or a glycidyl group. $R^5$ and $R^6$ each are a $C_5$-$C_{30}$ alkyl group having a ring structure, which may have a double bond or be separated by a heteroatom. Alternatively, $R^5$ and $R^6$ bond together to form a ring with the carbon atom to which they are attached. When $R^5$ and $R^6$ bond together to form a ring, the number of carbon atoms in the ring including the carbon atom to which they are attached is from 5 to 30, more specifically 6 to 26. $R^7$ is a single bond or a straight or branched $C_1$-$C_6$ alkylene group.

Suitable alkyl groups include methyl, ethyl, propyl, isopropyl, butyl, isobutyl, tert-butyl, pentyl, cyclopentyl, hexyl, cyclohexyl, octyl, decyl, norbornyl, and adamantyl. Suitable aryl groups include phenyl, tolyl, and xylyl. Suitable alkenyl groups include vinyl, allyl, propenyl, butenyl, hexenyl, cyclohexenyl, octenyl, and benzyl. Suitable acetal groups include methoxymethyl, ethoxymethyl, ethoxyethyl, isopropoxyethyl, methoxyisopropyl, methoxyisobutyl, tetrahydrofuranyl, and tetrahydropyranyl. Suitable acyl groups include methoxycarbonyl, ethoxycarbonyl, isopropylcarbonyl, tert-butoxycarbonyl, and cyclohexylcarbonyl. Suitable alkylene groups include methylene, ethylene, trimethylene, and tetramethylene.

Illustrative examples of the compound having formula (1) are given below.

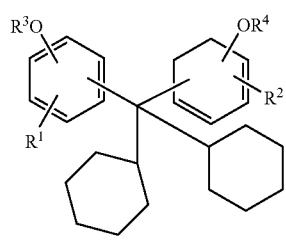

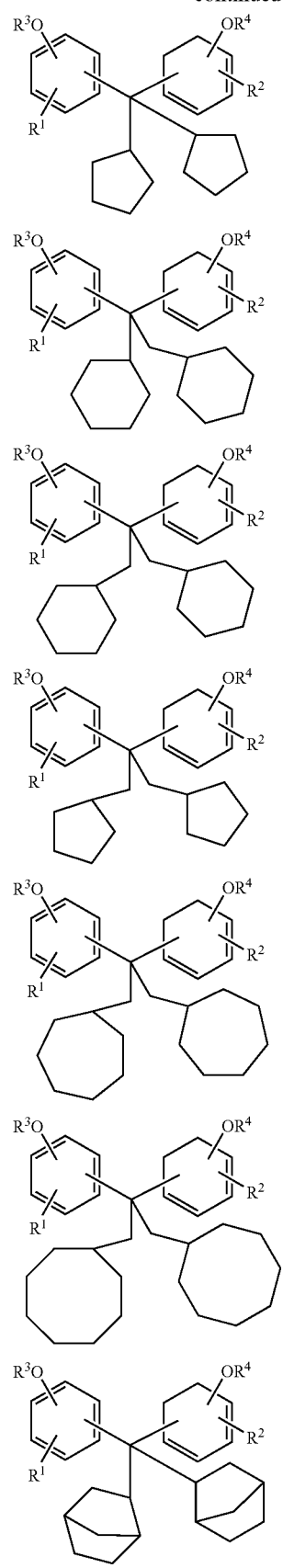

-continued
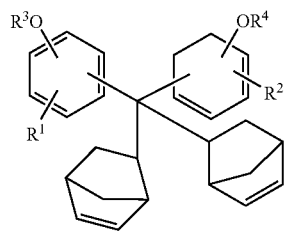
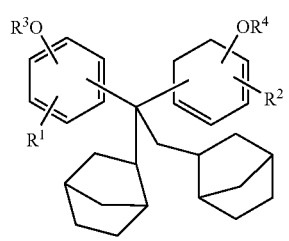
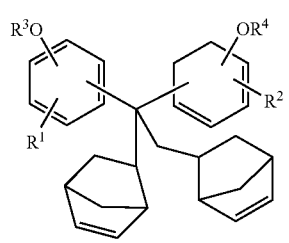
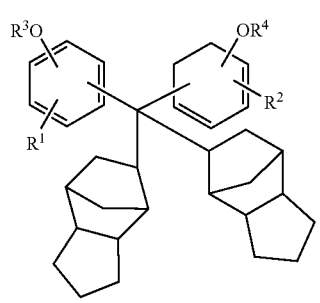
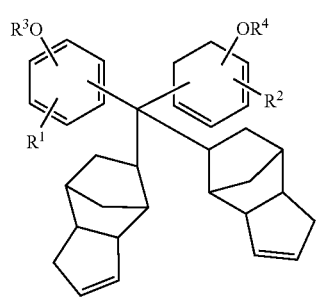
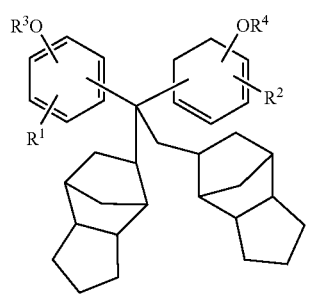
-continued
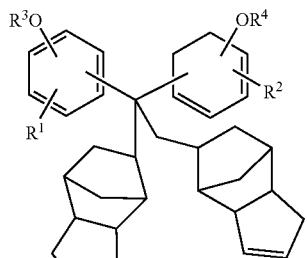
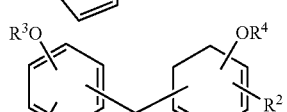
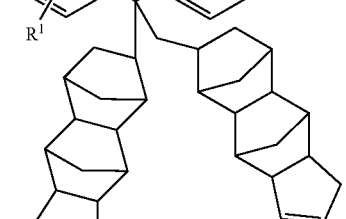
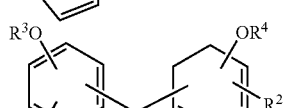
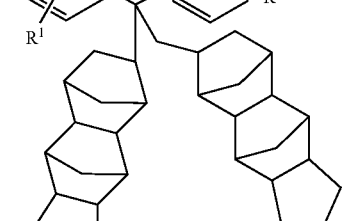
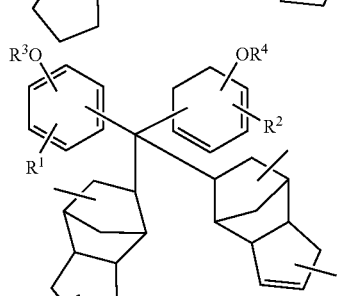
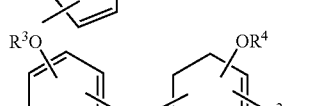
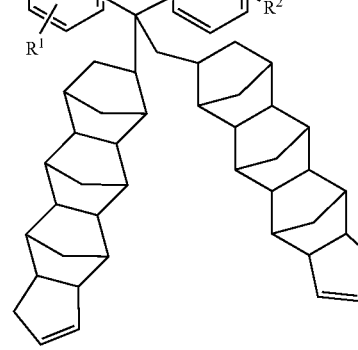

-continued
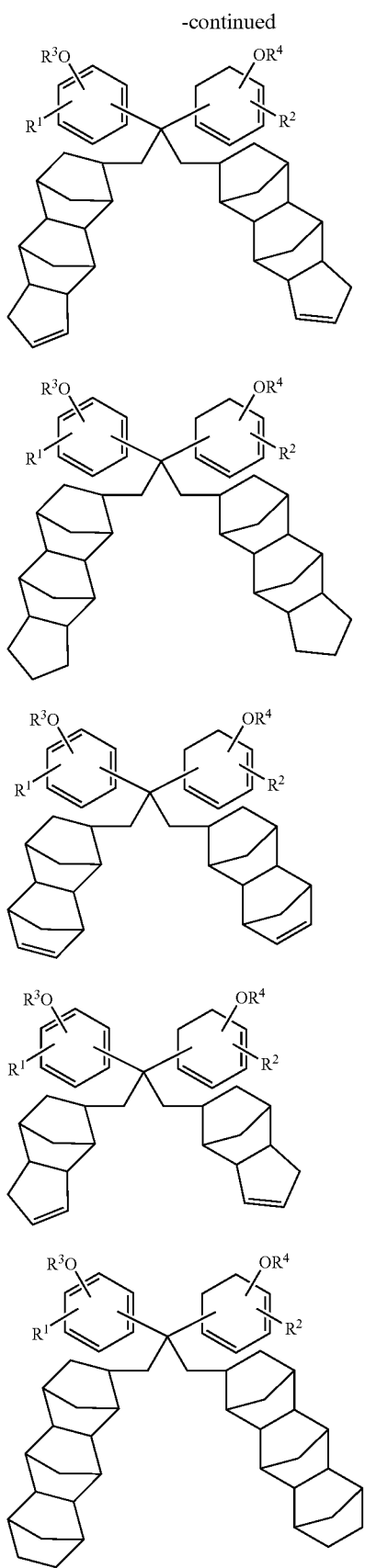
-continued
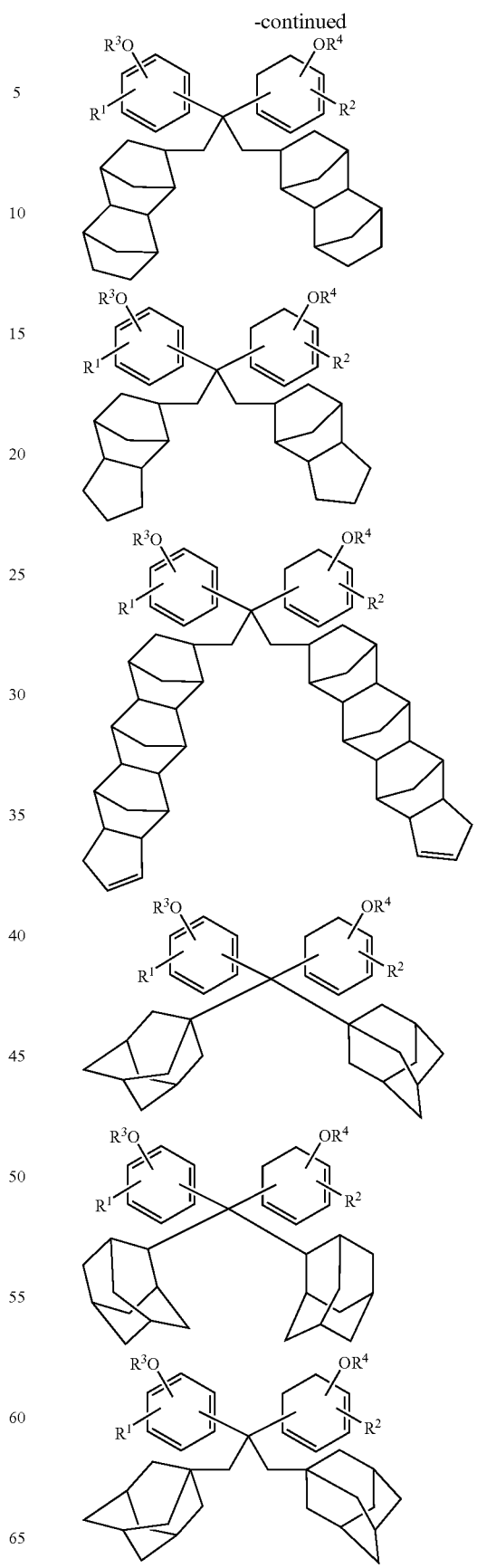

-continued
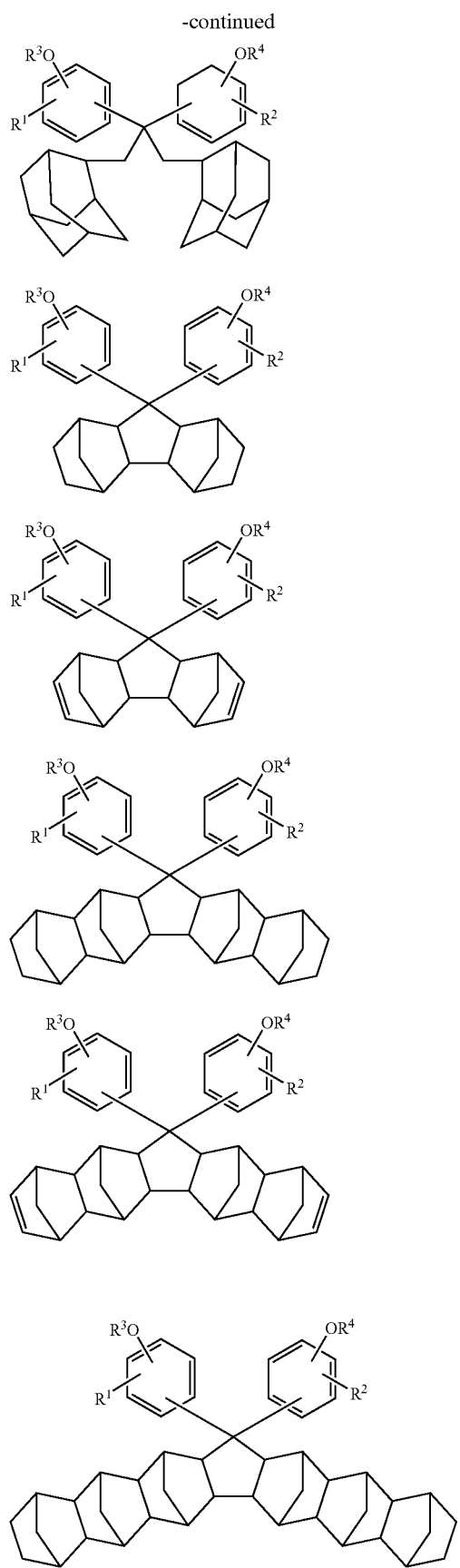
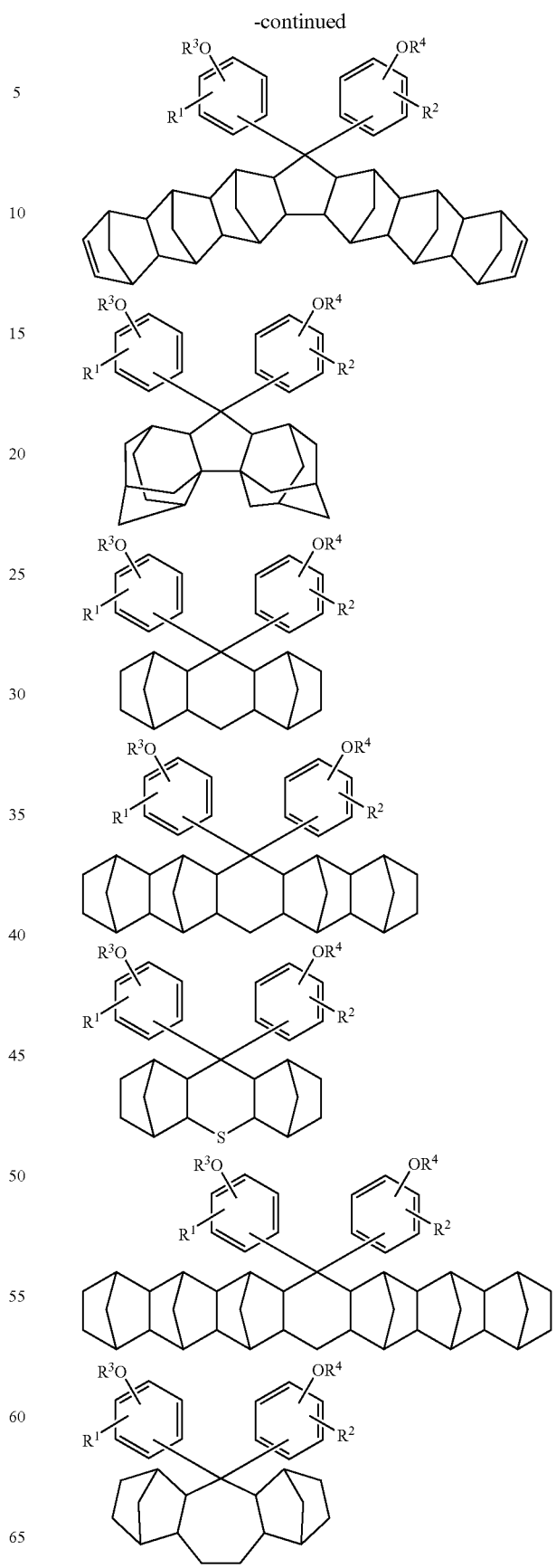

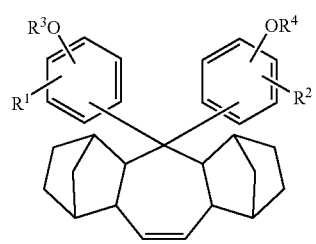
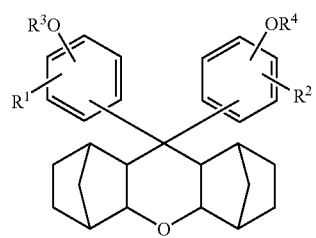
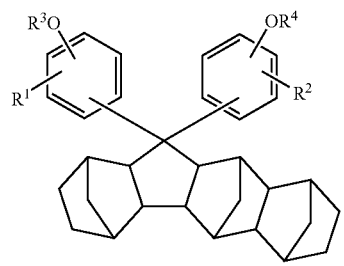
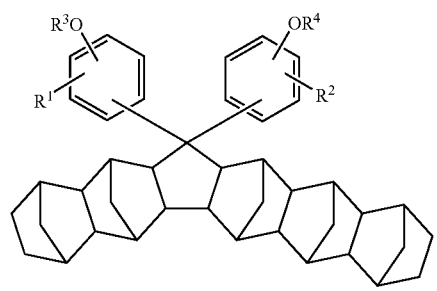
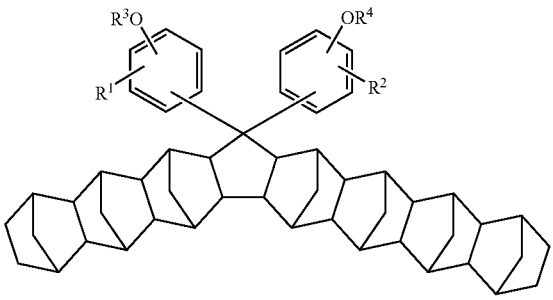
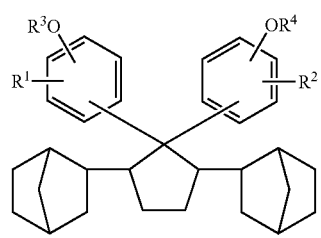
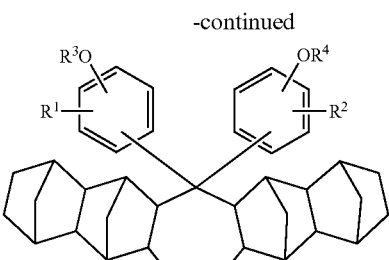
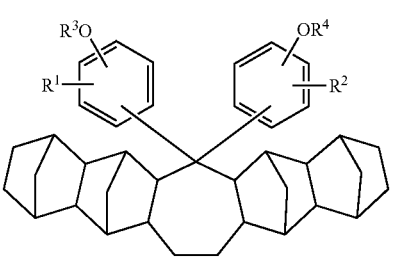
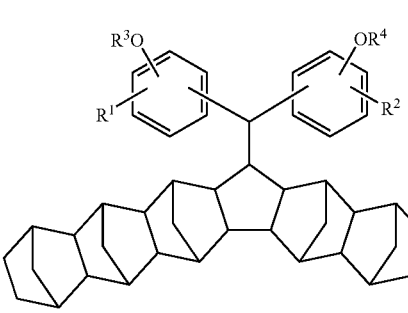
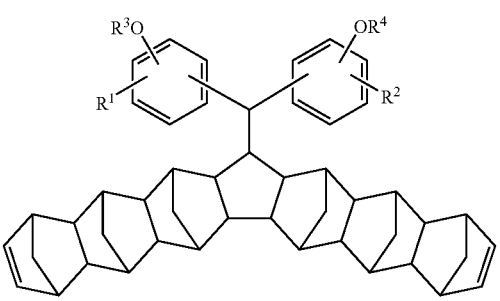
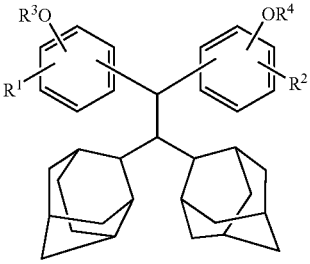
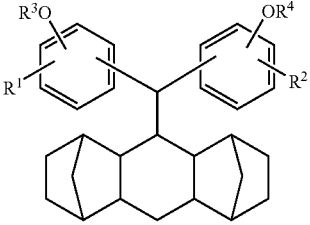

-continued
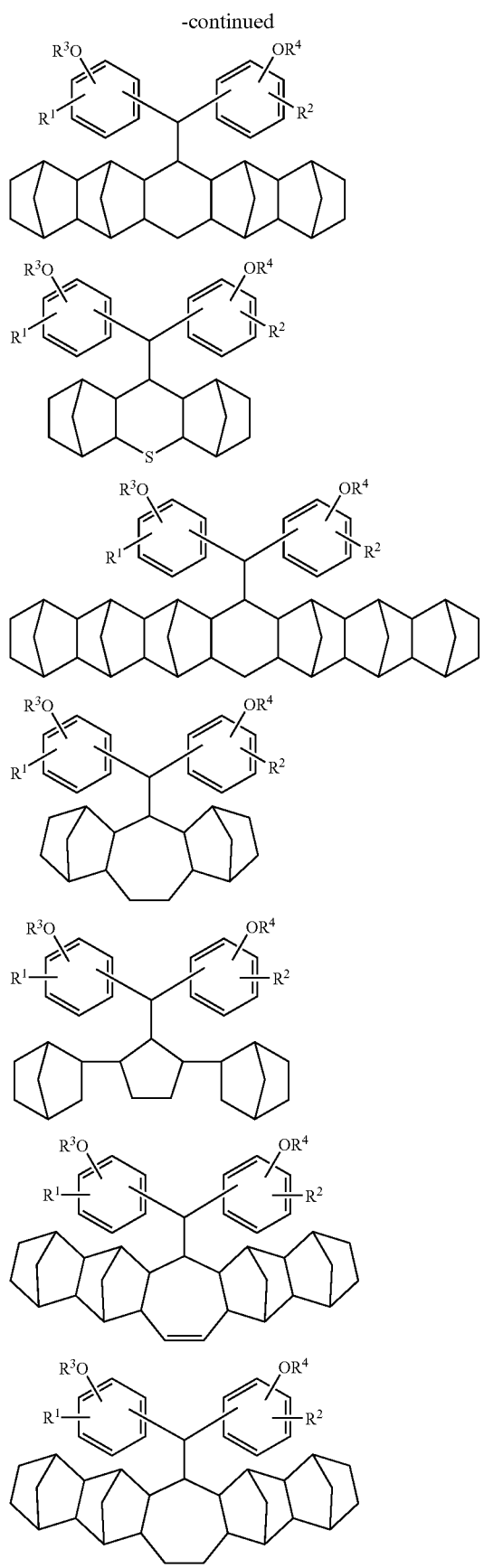
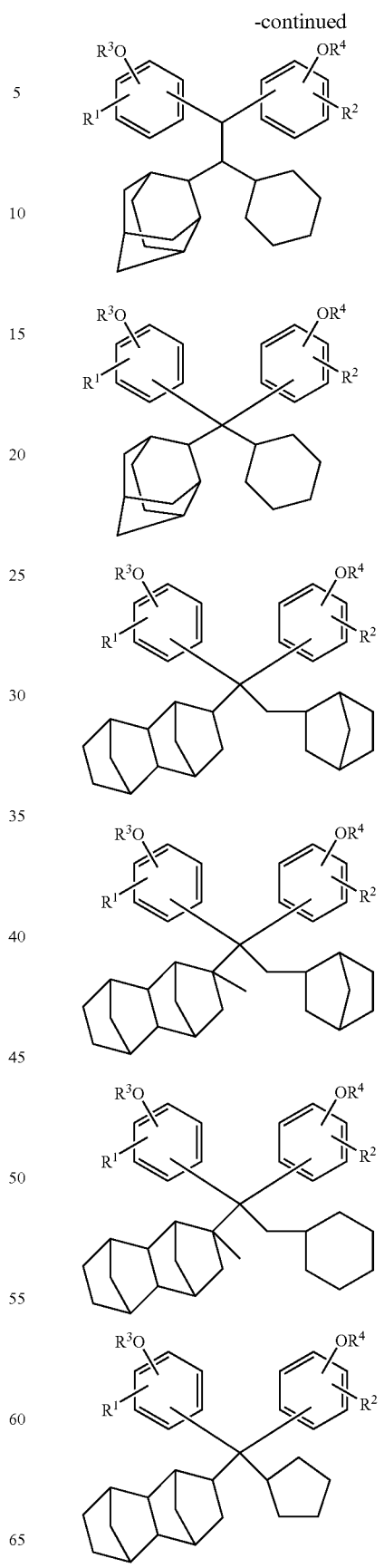

-continued

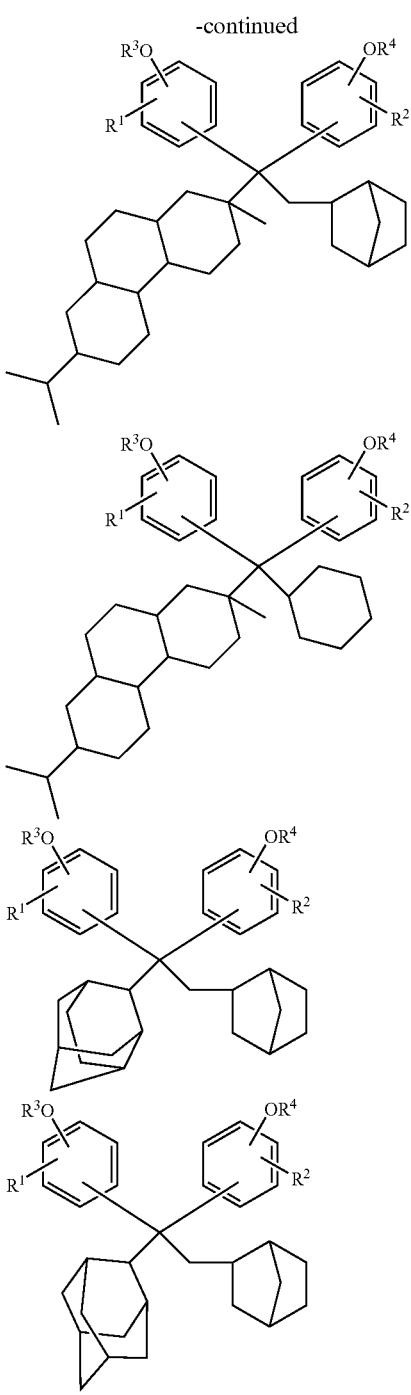

Herein, $R^1$, $R^2$, $R^3$, and $R^4$ are as defined above. Preferably $R^3$ and $R^4$ are hydrogen or glycidyl, more preferably hydrogen.

Those compounds of formula (1) wherein $R^3$ and $R^4$ are H may be produced by reacting a phenol with a corresponding cyclic ketone in an ordinary way. Those wherein $R^3$ and $R^4$ are glycidyl may be produced by converting the phenolic hydroxyl group on the phenol into glycidyl in an ordinary way. Also, those wherein $R^3$ and $R^4$ are alkyl, alkenyl, aryl, acetal or acyl groups may be produced likewise by converting the phenolic hydroxyl groups into the desired groups in an ordinary way.

On use of the specific bisphenol compound as the undercoat layer according to the invention, the compound of formula (1) itself may be added to form an undercoat layer. Alternatively, the bisphenol compound of formula (1) may be previously converted to a novolac form through condensation reaction with an aldehyde, that is, a resin comprising recurring units of formula (2) may be added.

Examples of the aldehyde which can be used herein include formaldehyde, trioxan, paraformaldehyde, benzaldehyde, acetaldehyde, propylaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, and furfural. Inter alia, formaldehyde is most preferred. The aldehydes may be used alone or in admixture of two or more. An appropriate amount of the aldehyde used is 0.2 to 5 moles, more preferably 0.5 to 2 moles per mole of the phenol.

A catalyst may be used in the condensation reaction of phenols with aldehydes. Suitable catalysts are acidic catalysts including hydrochloric acid, nitric acid, sulfuric acid, formic acid, oxalic acid, acetic acid, methanesulfonic acid, camphorsulfonic acid, tosylic acid, and trifluoromethanesulfonic acid. An appropriate amount of the acidic catalyst used is $1 \times 10^{-5}$ to $5 \times 10^{-1}$ mole per mole of the phenol.

Notably, the aldehydes are not always necessary in the case of copolymerization reaction with compounds having a non-conjugated double bond, such as indene, hydroxyindene, benzofuran, hydroxyanthracene, acenaphthylene, biphenyl, bisphenol, trisphenol, dicyclopentadiene, tetrahydroindene, 4-vinylcyclohexene, norbornadiene, 5-vinylnorborn-2-ene, α-pinene, β-pinene, and limonene.

A solvent is used in the polycondensation while it may be selected from water, methanol, ethanol, propanol, butanol, tetrahydrofuran, dioxane, and mixtures thereof. The solvent is preferably used in an amount of 0 to 2,000 parts by weight per 100 parts by weight of the reactants.

The reaction temperature may be selected as appropriate depending on the reactivity of reactants although it is usually in the range of 10 to 200° C.

The condensation may be conducted by charging the phenol, aldehyde, and catalyst all at once or by adding dropwise the phenol and aldehyde in the presence of the catalyst.

After the completion of polycondensation reaction, the reactor is heated to a temperature of 130 to 230° C. for removing the unreacted monomers and catalyst in the system. The volatiles may be removed at such temperature under a vacuum of about 1 to 50 mmHg.

The bisphenol compounds of formula (1) may be polymerized alone or copolymerized with other phenol monomers.

Copolymerizable phenols include phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, 2-phenylphenol, 3-phenylphenol, 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, pyrogallol, thymol, and isothymol.

Examples of other monomers which can be copolymerized include naphthols such as 1-naphthol, 2-naphthol, 2-methyl-1-naphthol, 4-methoxy-1-naphthol, and 7-methoxy-2-naphthol; dihydroxynaphthalenes such as 1,5-dihydroxynaphthalene, 1,7-dihydroxynaphthalene, and 2,6-dihydroxynaphthalene; methyl 3-hydroxy-naphthalene-2-carboxylate, indene, hydroxyindene, benzofuran, hydroxyanthracene, acenaphthylene, biphenyl, bisphenol, trisphenol, dicyclopentadiene, tetrahydroindene, 4-vinylcyclohexene, norbornadiene, 5-vinylnorborn-2-ene, α-pinene, β-pinene, and limonene. Copolymers of three or more monomers including any of these monomers are also acceptable.

The novolac resin thus produced should preferably contain 10 to 100 mol %, more preferably 30 to 100 mol % of recurring units of formula (2). The content of recurring units derived from the copolymerizable phenol monomer is preferably 0 to 90 mol %, more preferably 0 to 80 mol %, and the content of recurring units derived from the copolymerizable other monomer is preferably 0 to 90 mol %, more preferably 0 to 80 mol %.

The novolac resin should preferably have a weight average molecular weight (Mw) of 1,000 to 30,000, more preferably 2,000 to 20,000, as measured by gel permeation chromatography (GPC), versus polystyrene standards. Its molecular weight distribution or dispersity (Mw/Mn) is preferably in the range of 1.2 to 7. A narrow dispersity which is arrived at by cutting off monomeric and oligomeric components or a low-molecular-weight fraction having a Mw of not more than 1,000 offers benefits of more efficient crosslinking and reduced amounts of volatile components during baking, preventing contamination around the baking cup.

Into the novolac resin after condensation, a fused aromatic or alicyclic substituent group may be subsequently introduced at the ortho-position relative to phenol, using an acidic catalyst.

Illustrative examples of the substituent group which can be introduced are given below.

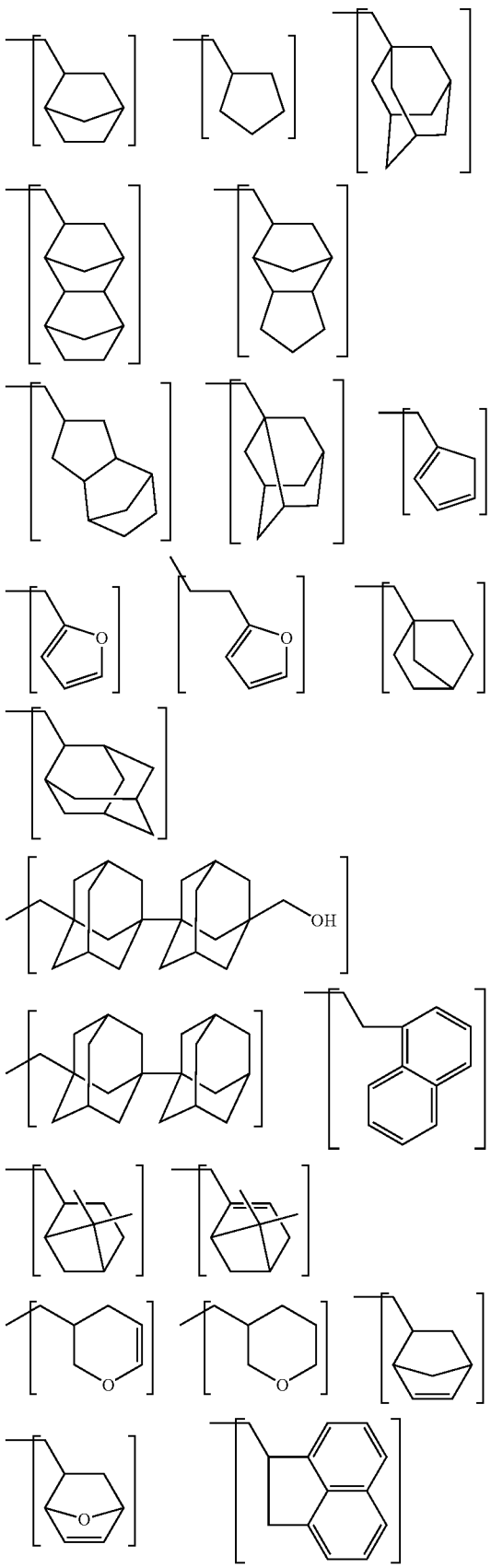

-continued

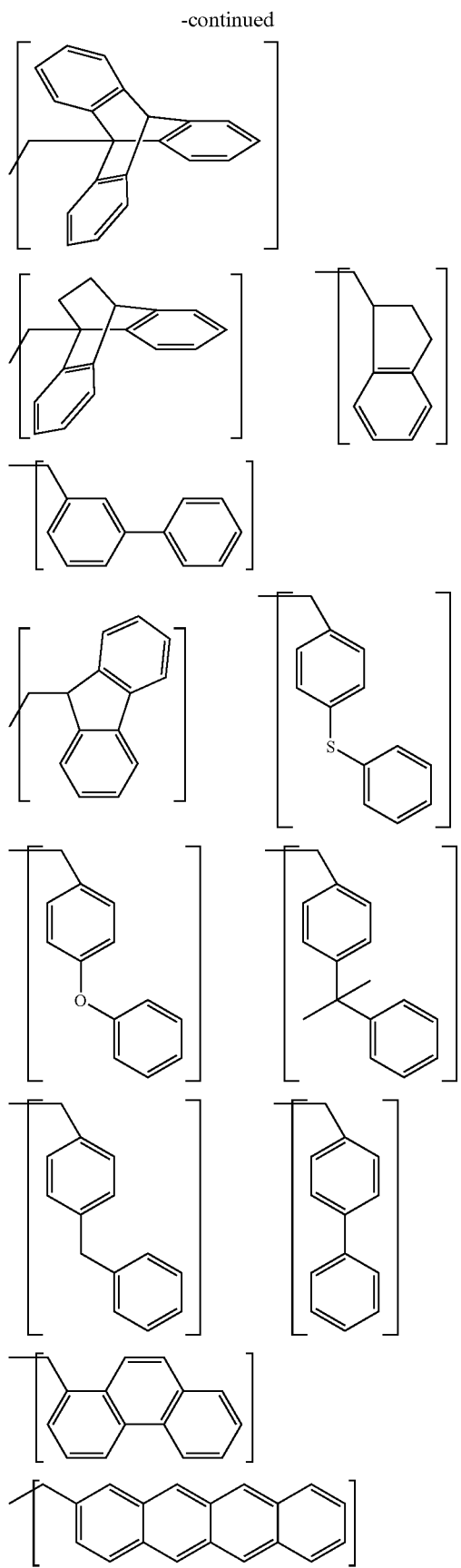

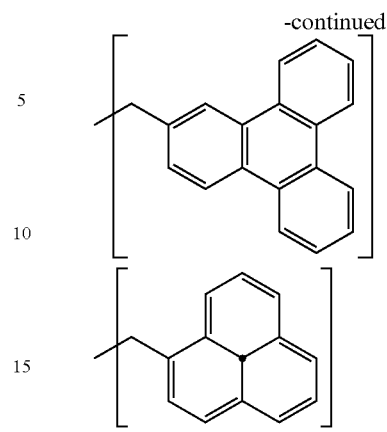

Of these substituent groups, polycyclic aromatic groups such as anthracenemethyl and pyrenemethyl groups are most preferred for 248-nm exposure. Those groups having alicyclic and naphthalene structures are preferred for improved transparency at 193 nm. In contrast, since the benzene ring has a window of improved transparency at the wavelength 157 nm, the absorption wavelength must be shifted so as to increase the absorption. The furan ring has absorption at a shorter wavelength than the benzene ring and is thus improved in absorption at 157 nm, but to a very small extent. Naphthalene, anthracene and pyrene rings are preferably used because of increased absorption due to a shift of the absorption wavelength to longer side and because these aromatic rings have the additional advantage of improved etching resistance.

The method of introducing a substituent group is by adding an alcohol whose hydroxyl group provides an attachment site of the substituent group to the polymer as polymerized in the presence of an acid catalyst, for thereby introducing the substituent group at the ortho- or para-position relative to the hydroxy group on the phenol. Suitable acid catalysts include acidic catalysts such as hydrochloric acid, nitric acid, sulfuric acid, formic acid, oxalic acid, acetic acid, methanesulfonic acid, n-butanesulfonic acid, camphorsulfonic acid, tosylic acid, and trifluoromethanesulfonic acid. An appropriate amount of the acidic catalyst used is $1\times10^{-5}$ to $5\times10^{-1}$ mole per mole of the phenol. An appropriate amount of the substituent group introduced is in the range of 0 to 0.8 mole per mole of hydroxyl group on the phenol.

The inventive novolac resin comprising recurring units of formula (2) can be hydrogenated to further improve its transparency at 193 nm. The degree of hydrogenation is preferably up to 80 mol %, more preferably up to 60 mol % of the aromatic groups.

Further, the compound of formula (1) and/or the novolac resin comprising recurring units of formula (2) can be blended with another polymer. Preferred for this blending purpose are polymers which can serve the functions of improving film formation by spin coating and burying in stepped substrates when mixed with the compound of formula (1) or the novolac resin comprising recurring units of formula (2). More preferably a choice may be made of materials having a high carbon density and etching resistance. Suitable blending polymers include novolac resins derived from phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t- butylphenol, 4-t-butylphenol, 2-phenylphenol, 3-phenylphenol 4-phenylphenol, 3,5-diphenylphenol, 2-naphthylphenol, 3-naphthylphenol, 4-naphthylphenol, 4-tritylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, pyrogallol, thymol, isothymol, 4,4'-(9H-fluoren-9-ylidene)bisphenol, 2,2'-dimethyl-4,4'-(9H-fluoren-9-ylidene)bisphenol, 2,2'-diallyl-4,4'-(9H-fluoren-9-ylidene)bisphenol, 2,2'-difluoro-4,4'-(9H-fluoren-9-ylidene)bisphenol, 2,2'-diphenyl-4,4'-(9H-fluoren-9-ylidene)bisphenol, 2,2'-dimethoxy-4,4'-(9H-fluoren-9-ylidene)bisphenol, 2,3,2',3'-tetrahydro-(1,1')-spirobiindene-6,6'-diol, 3,3,3',3'-tetramethyl-2,3,2',3'-tetrahydro-(1,1')-spirobiindene-6,6'-diol, 3,3,3',3',4,4'-hexamethyl-2,3,2',3'-tetrahydro-(1,1')-spirobiindene-6,6'-diol, 2,3,2',3'-tetrahydro-(1,1')-spirobiindene-5,5'-diol, 5,5'-dimethyl-3,3,3',3'-tetramethyl-2,3,2',3'-tetrahydro-(1,1')-spirobiindene-6,6'-diol, 1-naphthol, 2-naphthol, 2-methyl-1-naphthol, 4-methoxy-1-naphthol, 7-methoxy-2-naphthol, and dihydroxynaphthalenes such as 1,5-dihydroxynaphthalene, 1,7-dihydroxynaphthalene and 2,6-dihydroxynaphthalene, methyl 3-hydroxy-naphthalene-2-carboxylate, indene, hydroxyindene, benzofuran, hydroxyanthracene, acenaphthylene, biphenyl, bisphenol, trisphenol, dicyclopentadiene, tetrahydroindene, 4-vinylcyclohexene, norbornadiene, 5-vinylnorborn-2-ene, α-pinene, β-pinene, limonene, etc.; and polyhydroxystyrene, polystyrene, polyvinyl naphthalene, polyvinyl anthracene, polyvinyl carbazole, polyindene, polyacenaphthylene, polynorbornene, polycyclodecene, polytetracyclododecene, polynortricyclene, poly(meth)acrylate, and copolymers thereof.

The amount of the blending polymer compounded is usually 0 to 1,000 parts by weight, preferably 0 to 500 parts by weight per 100 parts by weight of the compound of formula (1) or the novolac resin comprising recurring units of formula (2).

One of the functions required for the undercoat layer including an antireflective film is the elimination of intermixing with the overcoat layer (i.e., silicon-containing intermediate layer and resist layer) and the elimination of diffusion of low molecular weight components into the overcoat layer (see Proc. SPIE Vol. 2195, pp. 225-229 (1994)). One common means for preventing intermixing and diffusion is by baking an antireflective film as spin coated for inducing thermal crosslinkage. Then, in the event the antireflective film material contains a crosslinker, a method of introducing crosslinkable substituent groups into the polymer may be employed. Absent a particular crosslinker, the specific bisphenol compound with a group of many carbon atoms represented by formula (1) and a novolac resin comprising recurring units derived by novolac formation of a bisphenol compound as represented by the general formula (2) can be crosslinked by heating at a temperature of 300° C. or higher for inducing condensation reaction of hydroxyl groups.

Crosslinker

Examples of the crosslinker which can be used herein include melamine compounds, guanamine compounds, glycoluril compounds and urea compounds having substituted thereon at least one group selected from among methylol, alkoxymethyl and acyloxymethyl groups, epoxy compounds, isocyanate compounds, azido compounds, and compounds having a double bond such as an alkenyl ether group. These compounds may be used as an additive or introduced as pendant groups on polymer side chains. Compounds having a hydroxy group are also useful as the crosslinker.

Of the foregoing compounds, examples of suitable epoxy compounds include tris(2,3-epoxypropyl)isocyanurate, trimethylolmethane triglycidyl ether, trimethylolpropane triglycidyl ether, and triethylolethane triglycidyl ether. Examples of the melamine compound include hexamethylol melamine, hexamethoxymethyl mel amine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and,mixtures thereof, and tetramethoxyethyl urea.

Examples of the alkenyl ether group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

Other suitable crosslinkers include alcoholic group-containing compounds such as naphthol novolac, m- and p-cresol novolac, naphthol-dicyclopentadiene novolac, m- and p-cresol-dicyclopentadiene novolac, 4,8-bis(hydroxymethyl)tricyclo[5.2.1.0$^{2,6}$]-decane, pentaerythritol, 1,2,6-hexanetriol, 4,4',4"-methylidene triscyclohexanol, 4,4'-[1-[4-[1-(4-hydroxycyclohexyl)-1-methylethyl]phenyl]-ethylidene]biscyclohexanol, [1,1'-bicyclohexyl]-4,4'-diol, methylenebiscyclohexanol, decahydronaphthalene-2,6-diol, and [1,1'-bicyclohexyl]-3,3',4,4'-tetrahydroxyl; and low-nuclear phenol compounds such as bisphenol, methylene bisphenol, 2,2'-methylenebis[4-methylphenol], 4,4'-methylidene-bis[2,6-dimethylphenol], 4,4'-(1-methyl-ethylidene)bis[2-methylphenol], 4,4'-cyclohexylidene bisphenol, 4,4'-(1,3-dimethylbutylidene)bisphenol, 4,4'-(1-methylethylidene)bis[2,6-dimethylphenol], 4,4'-oxybisphenol, 4,4'-methylenebisphenol, bis(4-hydroxyphenyl)methanone, 4,4'-methylene bis[2-methylphenol], 4,4'-[1,4-phenylenebis(1-methylethylidene)]bisphenol, 4,4'-(1,2-ethanediyl)bisphenol, 4,4'-(diethylsilylene)bisphenol, 4,4'-[2,2,2-trifluoro-1-(trifluoromethyl)ethylidene]bisphenol, 4,4',4"-methylidene trisphenol, 4,4'-[1-(4-hydroxyphenyl)-1-methylethyl]phenyl)ethylidene]-bisphenol, 2,6-bis[(2-hydroxy-5-methylphenyl)methyl]-4-methylphenol, 4,4',4"-ethylidyne tris[2-methylphenol], 4,4',4"-ethylidyne trisphenol, 4,6-bis[(4-hydroxyphenyl)methyl]-1,3-benzenediol, 4,4'-[(3,4-dihydroxyphenyl)methylene]bis[2-methylphenol], 4,4',4",4'"-(1,2-ethanediylidene)tetrakisphenol, 4,4',4",4'"-

(ethanediylidene)tetrakis[2-methylphenol], 2,2'-methylenebis[6-[(2-hydroxy-5-methylphenyl)methyl]-4-methylphenol], 4,4',4'',4'''-(1,4-phenylenedimethylidyne)tetrakisphenol, 2,4,6-tris(4-hydroxyphenylmethyl)-1,3-benzenediol, 2,4',4''-methylidenetrisphenol, 4,4',4'''-(3-methyl-1-propanyl-3-ylidene)trisphenol, 2,6-bis[(4-hydroxy-3-fluorophenyl)methyl]-4-fluorophenol, 2,6-bis[4-hydroxy-3-fluorophenyl)methyl]-4-fluorophenol, 3,6-bis[(3,5-dimethyl-4-hydroxyphenyl)methyl]-1,2-benzenediol, 4,6-bis[(3,5-dimethyl-4-hydroxyphenyl)methyl]-1,3-benzenediol, p-methylcalix[4]arene, 2,2'-methylenebis[6-[(2,5/3,6-dimethyl-4/2-hydroxyphenyl)methyl]-4-methylphenol, 2,2'-methylenebis[6-[(3,5-dimethyl-4-hydroxyphenyl)methyl]-4-methylphenol, 4,4',4'',4'''-tetrakis[(1-methylethylidene)bis(1,4-cyclohexylidene)]phenol, 6,6'-methylenebis[4-(4-hydroxyphenylmethyl)-1,2,3-benzenetriol, and 3,3',5,5'-tetrakis[(5-methyl-2-hydroxyphenyl)methyl]-[(1,1'-biphenyl)-4,4'-diol], in which a hydroxyl group is converted with epichlorohydrin into glycidyl ether.

In the resist undercoat-forming material of the invention, the crosslinker is preferably compounded in an amount of 3 to 50 parts by weight, more preferably 5 to 40 parts by weight per 100 parts by weight of the base polymer (the total of compound of formula (1), novolac resin comprising recurring units of formula (2), and blending polymer). Less than 3 pbw of the crosslinker may allow for mixing with the resist film. More than 50 pbw of the crosslinker may degrade the antireflection effect, allow the crosslinked film to crack, or lead to a decline of etching resistance due to a reduced carbon density.

Acid Generator

An acid generator may be added to the resist undercoat-forming material of the invention to accelerate the thermally induced crosslinking reaction. Acid generators include those which generate an acid through pyrolysis and those which generate an acid upon exposure to light, and both are useful.

The acid generators used herein include
(i) onium salts of the formula (P1a-1), (P1a-2), (P1a-3) or (P1b),
(ii) diazomethane derivatives of the formula (P2),
(iii) glyoxime derivatives of the formula (P3),
(iv) bissulfone derivatives of the formula (P4),
(v) sulfonic acid esters of N-hydroxyimide compounds of the formula (P5),
(vi) β-ketosulfonic acid derivatives,
(vii) disulfone derivatives,
(viii) nitrobenzylsulfonate derivatives, and
(ix) sulfonate derivatives.

These acid generators are described in detail.

(i) Onium Salts of Formula (P1a-1), (P1a-2) or (P1a-3):

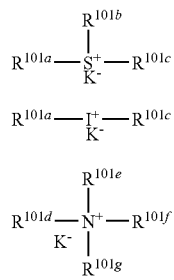

Herein, $R^{101a}$, $R^{101b}$, and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups. Also, $R^{101b}$ and $R^{101c}$, taken together, may form a ring. $R^{101b}$ and $R^{101c}$ each are alkylene groups of 1 to 6 carbon atoms when they form a ring. $K^-$ is a non-nucleophilic counter ion. $R^{101d}$, $R^{101e}$, $R^{101f}$, and $R^{101g}$ stand for the same as $R^{101a}$, $R^{101b}$, and $R^{101c}$ as well as hydrogen atoms. A pair of $R^{101d}$ and $R^{101e}$ or a combination of $R^{101d}$, $R^{101e}$ and $R^{101f}$ may form a ring, and each of $R^{101d}$ and $R^{101e}$ or each of $R^{101d}$, $R^{101e}$ and $R^{101f}$ is an alkylene group of 3 to 10 carbon atoms when they form a ring. $R^{101d}$, $R^{101e}$, $R^{101f}$, and $R^{101g}$, taken together, may stand for a heterocyclic aromatic ring having the nitrogen atom (in the formula) incorporated therein.

$R^{101a}$, $R^{101b}$, $R^{101c}$, $R^{101d}$, $R^{101e}$, $R^{101f}$, and $R^{101g}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl. Examples of the non-nucleophilic counter ion represented by $K^-$ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imide acids such as bis(trifluoromethylsulfonyl)imide, bis(perfluoroethylsulfonyl)imide and bis(perfluorobutylsulfonyl)imide; methide acids such as tris(trifluoromethylsulfonyl)methide and tris(perfluoroethylsulfonyl)mathide; sulfonates having fluorine substituted at alpha-position as represented by the following formula (K-1) and sulfonates having fluorine substituted at alpha- and beta-positions as represented by the following formula (K-2).

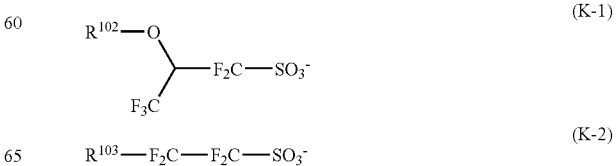

In formula (K-1), $R^{102}$ is a hydrogen atom, straight, branched or cyclic $C_1$-$C_{20}$ alkyl or acyl group, $C_2$-$C_{20}$ alkenyl group, or $C_6$-$C_{20}$ aryl or aryloxy group. In formula (K-2), $R^{103}$ is a hydrogen atom, straight, branched or cyclic $C_1$-$C_{20}$ alkyl group, $C_2$-$C_{20}$ alkenyl group, or $C_6$-$C_{20}$ aryl group.

Examples of the heterocyclic aromatic ring having the nitrogen atom (in formula (P1a-3)) incorporated therein, represented by $R^{101d}$, $R^{101e}$, $R^{101f}$, and $R^{101g}$ include imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

The salts of (P1a-1) and (P1a-2) have both the functions of a photoacid generator and a thermal acid generator while the salts of (P1a-3) function as a thermal acid generator.

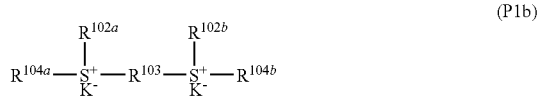
(P1b)

Herein, $R^{102a}$ and $R^{102b}$ independently represent straight, branched or cyclic alkyl groups of 1 to 8 carbon atoms. $R^{103}$ represents a straight, branched or cyclic alkylene group of 1 to 10 carbon atoms. $R^{104a}$ and $R^{104b}$ independently represent 2-oxoalkyl groups of 3 to 7 carbon atoms. $K^-$ is a non-nucleophilic counter ion.

Illustrative of the alkyl groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the alkylene groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the 2-oxoalkyl groups represented by $R^{104a}$ and $R^{104b}$ are 2-oxopropyl, 2-oxocyclopentyl, 2-oxocyclohexyl, and 2-oxocycloheptyl. Illustrative examples of the counter ion represented by $K^-$ are the same as exemplified for formulae (P1a-1), (P1a-2) and (P1a-3).

(ii) Diazomethane Derivatives of Formula (P2)

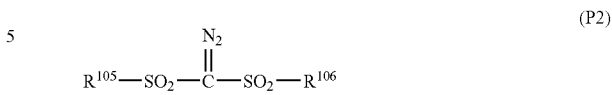
(P2)

Herein, $R^{105}$ and $R^{106}$ independently represent straight, branched or cyclic $C_1$-$C_{12}$ alkyl or halogenated alkyl groups, $C_6$-$C_{20}$ aryl or halogenated aryl groups, or $C_7$-$C_{12}$ aralkyl groups.

Of the groups represented by $R^{105}$ and $R^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

(iii) Glyoxime Derivatives of Formula (P3)

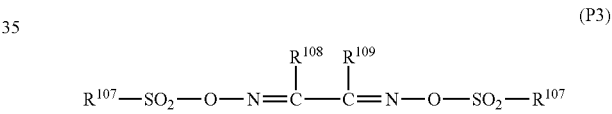
(P3)

Herein, $R^{107}$, $R^{108}$ and $R^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms. Also, $R^{108}$ and $R^{109}$, taken together, may form a ring. $R^{108}$ and $R^{109}$ each are straight or branched alkylene groups of 1 to 6 carbon atoms when they form a ring.

Illustrative examples of the alkyl, halogenated alkyl, aryl, halogenated aryl, and aralkyl groups represented by $R^{107}$, $R^{108}$, and $R^{109}$ are the same as exemplified for $R^{105}$ and $R^{106}$. Examples of the alkylene groups represented by $R^{108}$ and $R^{109}$ include methylene, ethylene, propylene, butylene, and hexylene.

(iv) Bissulfone Derivatives of Formula (P4)

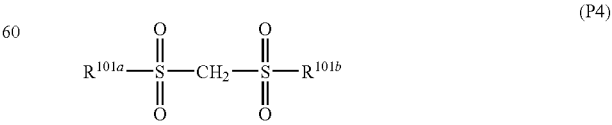
(P4)

Herein, $R^{101a}$ and $R^{101b}$ are as defined above.

(v) Sulfonic Acid Esters of N-hydroxyimide Compounds of Formula (P5)

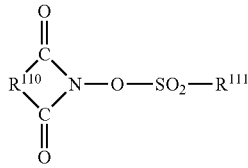

(P5)

Herein, $R^{110}$ is an $C_6$-$C_{10}$ arylene group, $C_1$-$C_6$ alkylene group, or $C_2$-$C_6$ alkenylene group wherein some or all of the hydrogen atoms may be replaced by straight or branched $C_1$-$C_4$ alkyl or alkoxy groups, nitro, acetyl, or phenyl groups. $R^{111}$ is a straight, branched or cyclic $C_1$-$C_8$ alkyl group, alkenyl, alkoxyalkyl, phenyl or naphthyl group wherein some or all of the hydrogen atoms may be replaced by $C_1$-$C_4$ alkyl or alkoxy groups, phenyl groups (which may have substituted thereon a $C_1$-$C_4$ alkyl or alkoxy, nitro, or acetyl group), hetero-aromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, ethylene, trimethylene, tetramethylene, phenylethylene, and norbornane-2,3-diyl; and exemplary alkenylene groups include 1,2-vinylene, 1-phenyl-1,2-vinylene, and 5-norbornene-2,3-diyl. Of the groups represented by $R^{111}$, exemplary alkyl groups are as exemplified for $R^{101a}$ to $R^{101c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the $C_1$-$C_4$ alkyl groups include methyl, ethyl, propyl, isopropyl, n-butyl, isobutyl and tert-butyl; the $C_1$-$C_4$ alkoxy groups include methoxy, ethoxy, propoxy, isopropoxy, n-butoxy, isobutoxy, and tert-butoxy; the phenyl groups which may have substituted thereon a $C_1$-$C_4$ alkyl or alkoxy, nitro, or acetyl group include phenyl, tolyl, p-tert-butoxyphenyl, p-acetylphenyl and p-nitrophenyl; the hetero-aromatic groups of 3 to 5 carbon atoms include pyridyl and furyl.

Illustrative examples of the acid generator include:
onium salts such as
tetramethylammonium trifluoromethanesulfonate,
tetramethylammonium nonafluorobutanesulfonate,
triethylammonium nonafluorobutanesulfonate,
pyridinium nonafluorobutanesulfonate,
triethylammonium camphorsulfonate,
pyridinium camphorsulfonate,
tetra-n-butylammonium nonafluorobutanesulfonate,
tetraphenylammonium nonafluorobutanesulfonate,
tetramethylammonium p-toluenesulfonate,
diphenyliodonium trifluoromethanesulfonate,
(p-tert-butoxyphenyl)phenyliodonium trifluoromethanesulfonate,
diphenyliodonium p-toluenesulfonate,
(p-tert-butoxyphenyl)phenyliodonium p-toluenesulfonate,
triphenylsulfonium trifluoromethanesulfonate,
(p-tert-butoxyphenyl)diphenylsulfonium trifluoromethanesulfonate,
bis(p-tert-butoxyphenyl)phenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
bis(p-tert-butoxyphenyl)phenylsulfonium p-toluenesulfonate,
tris(p-tert-butoxyphenyl)sulfonium p-toluenesulfonate,
triphenylsulfonium nonafluorobutanesulfonate,
triphenylsulfonium butanesulfonate,
trimethylsulfonium trifluoromethanesulfonate,
trimethylsulfonium p-toluenesulfonate,
cyclohexylmethyl(2-oxocyclohexyl)sulfonium trifluoromethanesulfonate,
cyclohexylmethyl(2-oxocyclohexyl)sulfonium p-toluenesulfonate,
dimethylphenylsulfonium trifluoromethanesulfonate,
dimethylphenylsulfonium p-toluenesulfonate,
dicyclohexylphenylsulfonium trifluoromethanesulfonate,
dicyclohexylphenylsulfonium p-toluenesulfonate,
trinaphthylsulfonium trifluoromethanesulfonate,
(2-norbornyl)methyl(2-oxocyclohexyl)sulfonium trifluoromethanesulfonate,
ethylenebis[methyl(2-oxocyclopentyl)sulfonium trifluoromethanesulfonate],
1,2'-naphthylcarbonylmethyltetrahydrothiophenium triflate,
triethylammonium nonaflate, tributylammonium nonaflate, tetraethylammonium nonaflate, tetrabutylammonium nonaflate,
triethylammonium bis(trifluoromethylsulfonyl)imide, and
triethylammonium tris(perfluoroethylsulfonyl)methide;
diazomethane derivatives such as
bis(benzenesulfonyl)diazomethane,
bis(p-toluenesulfonyl)diazomethane,
bis(xylenesulfonyl)diazomethane,
bis(cyclohexylsulfonyl)diazomethane,
bis(cyclopentylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane,
bis(tert-butylsulfonyl)diazomethane,
bis(n-amylsulfonyl)diazomethane,
bis(isoamylsulfonyl)diazomethane,
bis(sec-amylsulfonyl)diazomethane,
bis(tert-amylsulfonyl)diazomethane,
1-cyclohexylsulfonyl-1-(tert-butylsulfonyl)diazomethane,
1-cyclohexylsulfonyl-1-(tert-amylsulfonyl)diazomethane, and
1-tert-amylsulfonyl-1-(tert-butylsulfonyl)diazomethane;
glyoxime derivatives such as
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(p-toluenesulfonyl)-2-methyl-3,4-pentanedioneglyoxime,
bis-O-(n-butanesulfonyl)-α-dimethylg,yoxime,
bis-O-(n-butanesulfonyl)-α-diphenylglyoxime,
bis-O-(n-butanesulfonyl)-α-dicyclohexylglyoxime, bis-O-(n-butanesulfonyl)-2,3-pentanedioneglyoxime,
bis-O-(n-butanesulfonyl)-2-methyl-3,4-pentanedioneglyoxime,
bis-O-(methanesulfonyl)-α-dimethylglyoxime,
bis-O-(trifluoromethanesulfonyl)-α-dimethylglyoxime,
bis-O-(1,1,1-trifluoroethanesulfonyl)-α-dimethylglyoxime,
bis-O-(tert-butanesulfonyl)-α-dimethylglyoxime,
bis-O-(perfluorooctanesulfonyl)-α-dimethylglyoxime,
bis-O-(cyclohexanesulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-tert-butylbenzenesulfonyl)-α-dimethylglyoxime,
bis-O-(xylenesulfonyl)-α-dimethylglyoxime, and
bis-O-(camphorsulfonyl)-α-dimethylglyoxime;
   bissulfone derivatives such as
bisnaphthylsulfonylmethane, bistrifluoromethylsulfonylmethane,
bismethylsulfonylmethane, bisethylsulfonylmethane,
bispropylsulfonylmethane, bisisopropylsulfonylmethane,
bis-p-toluenesulfonylmethane, and bisbenzenesulfonylmethane;
   β-ketosulfonic acid derivatives such as
2-cyclohexylcarbonyl-2-(p-toluenesulfonyl)propane and
2-isopropylcarbonyl-2-(p-toluenesulfonyl)propane;
   disulfone derivatives such as diphenyl disulfone and dicyclohexyl disulfone;
   nitrobenzyl sulfonate derivatives such as
2,6-dinitrobenzyl p-toluenesulfonate and
2,4-dinitrobenzyl p-toluenesulfonate;
   sulfonic acid ester derivatives such as
1,2,3-tris(methanesulfonyloxy)benzene,
1,2,3-tris(trifluoromethanesulfonyloxy)benzene, and
1,2,3-tris(p-toluenesulfonyloxy)benzene; and
   sulfonic acid esters of N-hydroxyimides such as
N-hydroxysuccinimide methanesulfonate,
N-hydroxysuccinimide trifluoromethanesulfonate,
N-hydroxysuccinimide ethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide 1-octanesulfonate,
N-hydroxysuccinimide p-toluenesulfonate,
N-hydroxysuccinimide p-methoxybenzenesulfonate,
N-hydroxysuccinimide 2-chloroethanesulfonate,
N-hydroxysuccinimide benzenesulfonate,
N-hydroxysuccinimide 2,4,6-trimethylbenzenesulfonate,
N-hydroxysuccinimide 1-naphthalenesulfonate,
N-hydroxysuccinimide 2-naphthalenesulfonate,
N-hydroxy-2-phenylsuccinimide methanesulfonate,
N-hydroxymaleimide methanesulfonate,
N-hydroxymaleimide ethanesulfonate,
N-hydroxy-2-phenylmaleimide methanesulfonate,
N-hydroxyglutarimide methanesulfonate,
N-hydroxyglutarimide benzenesulfonate,
N-hydroxyphthalimide methanesulfonate,
N-hydroxyphthalimide benzenesulfonate,
N-hydroxyphthalimide trifluoromethanesulfonate,
N-hydroxyphthalimide p-toluenesulfonate,
N-hydroxynaphthalimide methanesulfonate,
N-hydroxynaphthalimide benzenesulfonate,
N-hydroxy-5-norbornene-2,3-dicarboxyimide methanesulfonate,
N-hydroxy-5-norbornene-2,3-dicarboxyimide trifluoromethanesulfonate, and
N-hydroxy-5-norbornene-2,3-dicarboxyimide p-toluenesulfonate.

Preferred among these acid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate, and 1,2'-naphthylcarbonylmethyltetrahydrothiophenium triflate;
diazomethane derivatives such as
bis(benzenesulfonyl)diazomethane,
bis(p-toluenesulfonyl)diazomethane,
bis(cyclohexylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane, and
bis(tert-butylsulfonyl)diazomethane;
glyoxime derivatives such as
bis-O-(p-toluenesulfonyl)-α-dimethylglyoxime and
bis-O-(n-butanesulfonyl)-α-dimethylglyoxime;
bissulfone derivatives such as bisnaphthylsulfonylmethane;
and sulfonic acid esters of N-hydroxyimide compounds such as
N-hydroxysuccinimide methanesulfonate,
N-hydroxysuccinimide trifluoromethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide p-toluenesulfonate,
N-hydroxynaphthalimide methanesulfonate, and
N-hydroxynaphthalimide benzenesulfonate.

These acid generators may be used singly or in combinations of two or more thereof. The acid generator is preferably added in an amount of 0.1 to 50 parts by weight, and especially 0.5 to 40 parts by weight, per 100 parts by weight of the base polymer. Less than 0.1 pbw of the acid generator may generate an insufficient amount of acid to induce crosslinking reaction whereas more than 50 pbw of the acid generator may invite a mixing phenomenon that the acid migrates into the overlaying resist.

Basic Compound

In the resist undercoat-forming material of the invention, a basic compound may be compounded for improving the storage stability. The basic compound plays the role of an acid quencher for preventing a minute amount of acid generated from the acid generator from promoting the crosslinking reaction during shelf storage.

Examples of suitable basic compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, and imide derivatives.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene; and pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g., nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide.

Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

The basic compound is preferably formulated in an amount of 0.001 to 2 parts by weight, and especially 0.01 to 1 part by weight, per 100 parts by weight of the entire base polymer. Less than 0.001 pbw of the basic compound may fail to provide the desired effect whereas more than 2 pbw of the basic compound may trap the entirety of thermally generated acid to inhibit crosslinking reaction.

Organic Solvent

The organic solvent used in the resist undercoat-forming material of the invention may be any organic solvent in which the base polymer, acid generator, crosslinker and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof. Of the above organic solvents, preferred are diethylene glycol dimethyl ether, 1-ethoxy-2-propanol, ethyl lactate, propylene glycol monomethyl ether acetate and propylene glycol monomethyl ether, and mixtures thereof.

The organic solvent is preferably added in an amount of about 200 to 10,000 parts by weight, especially about 300 to 5,000 parts by weight per 100 parts by weight of the entire base polymer.

Process

It is now described how to form a pattern using the resist undercoat-forming material of the invention.

Like photoresists, the undercoat material of the invention can be applied onto a processable substrate by any desired technique such as spin coating, to form an undercoat layer thereon. After spin coating, the coating is desirably baked in order to evaporate off the solvent and to promote crosslinking reaction for preventing the undercoat layer from mixing with the overlying resist. The baking is preferably effected at a temperature of 80 to 300° C. for a time of 10 to 300 seconds. The thickness of the undercoat layer may be suitably determined although it is preferably in the range of 30 to 20,000 nm, especially 50 to 15,000 nm. After the undercoat layer is formed, a silicon-containing resist layer is formed thereon in the case of the bilayer process, and a silicon-containing intermediate layer is formed thereon and a silicon-free single-layer resist layer is further formed on the intermediate layer in the case of the trilayer process.

The photoresist compositions for forming these resist layers may be well-known ones.

As the silicon-containing resist composition for the bilayer process, a positive photoresist composition comprising a silicon atom-containing polymer such as a polysilsesquioxane derivative or vinylsilane derivative as a base polymer, an organic solvent, an acid generator, and optionally, a basic compound and the like is often used from the standpoint of oxygen gas etching resistance. As the silicon atom-containing polymer, any of well-known polymers which are used in resist compositions of this type may be used.

As the silicon-containing intermediate layer for the tri-layer process, an intermediate layer based on polysilsesquioxane is preferably used. The provision of the intermediate layer with a function of antireflective coating is effective in holding down reflection.

Especially for 193-nm exposure, while the use of an aromatic group-rich material having high resistance to substrate etching as the undercoat layer provides a high k value and high substrate reflection, the combined use of an intermediate layer that restrains reflection is successful in reducing the substrate reflection to 0.5% or less.

As the intermediate layer having an antireflection effect, use is preferably made of acid or heat-crosslinkable polysilsesquioxane with anthracenyl groups as pendants for 248-nm and 157-nm exposure, and acid or heat-crosslinkable polysilsesquioxane with phenyl groups or silicon-silicon bond-bearing light absorbing groups as pendants for 193-nm exposure.

Also, an intermediate layer formed by chemical vapor deposition (CVD) may be used. Know intermediate layers formed by CVD and fully effective as an antireflective coating are SiON coatings. As compared with the CVD, formation of an intermediate layer by a spin coating technique is simple and economical. The topcoat resist material in the tri-layer process may be either positive or negative and may be the same as a commonly used single-layer resist material.

When the photoresist composition is applied to form a resist layer, a spin coating technique is preferably used as in the case of the undercoat layer. The resist composition is spin coated and then pre-baked, preferably at 80 to 180° C. for 10 to 300 seconds. Thereafter, the resist layer is routinely exposed to radiation through a desired pattern, post-exposure baked (PEB) and developed with a developer, obtaining a resist pattern. The thickness of the resist layer is preferably in a range of 30 to 500 nm, more preferably 50 to 400 nm, though not particularly limited. The radiation for exposure may be selected from among high-energy radiation having a wavelength of up to 300 nm, specifically excimer laser beams of 248 nm, 193 nm and 157 nm, soft X-rays of 3 to 20 nm, electron beams, and X-rays.

Next, etching is carried out using the resist pattern as a mask. In the bilayer process, the undercoat layer is typically etched with oxygen gas. In addition to oxygen gas, an inert gas such as He or Ar or another gas such as CO, $CO_2$, $NH_3$, $SO_2$, $N_2$, $NO_2$ or $H_2$ may be added to the etchant gas. The other gas is used for sidewall protection, that is, for preventing the pattern sidewalls from being undercut. Etching solely with CO, $CO_2$, $NH_3$, $SO_2$, $NO_2$ or $H_2$ gas without using oxygen gas is also acceptable. In the tri-layer process, the intermediate layer is etched with a fluorocarbon-base gas using the patterned resist as a mask. Then the undercoat layer is etched with oxygen gas (same as above) using the patterned intermediate layer as a mask.

Next, the processable substrate is etched by a conventional technique. For example, when the substrate is $SiO_2$ or SiN, etching with a fluorocarbon-base gas is employed. When the substrate is p-Si, Al or W, etching with a chlorine or bromine-base gas is employed. When the substrate processing is etching with a fluorocarbon-base gas, the silicon-containing resist in the bilayer resist process and the silicon-containing intermediate layer in the tri-layer process are stripped at the same time as the substrate processing. When the substrate is etched with a chlorine or bromine-base gas, the silicon-containing resist or the silicon-containing intermediate layer must be subsequently stripped by dry etching with a fluorocarbon-base gas after the substrate processing.

The undercoat layer of the invention is characterized by resistance to etching of the processable substrate.

The processable substrate is formed on a support substrate. The support substrate includes those of Si, α-Si, p-Si, $SiO_2$, SiN, SiON, W, TiN, Al and the like, and a suitable material different from the processable film (or processable substrate) is selected among them. The processable film is selected from low-k films of Si, $SiO_2$, SiON, SiN, p-Si, α-Si, W, W—Si, Al, Cu, Al—Si and the like and stop films thereof, and typically has a thickness of 50 to 10,000 nm, especially 100 to 5,000 nm.

The patterning process of the invention includes the step of applying the photoresist undercoat-forming material onto a substrate to form an undercoat layer. A photoresist composition is applied onto the undercoat layer, optionally via an intermediate layer, to form a photoresist layer. The photoresist layer in a predetermined region is exposed to radiation, and developed with a liquid developer to form a photoresist pattern. Using a dry etching apparatus, the undercoat layer and the. substrate are processed through the patterned photoresist layer as a mask. FIGS. 6 and 7 illustrate embodiments of the bilayer resist working process and trilayer resist working process, respectively.

Figure 6A:
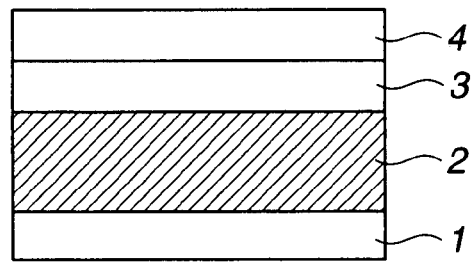
FIG. 6 illustrates steps of a bilayer resist working process.
Figure 6B:
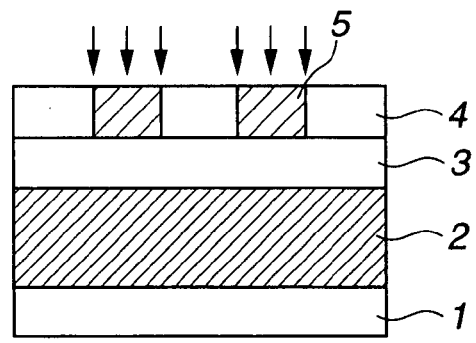
Figure 6C:
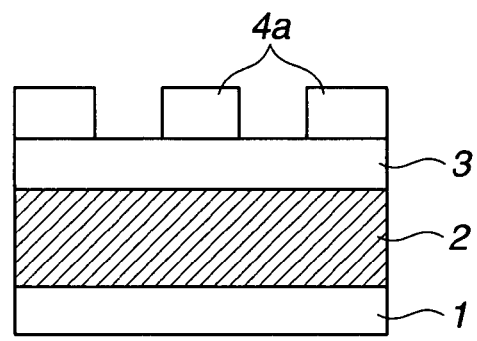
Figure 6D:
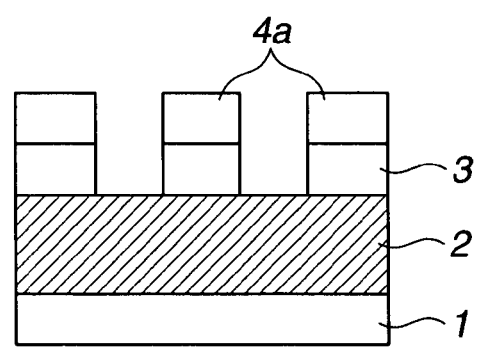
Figure 6E:
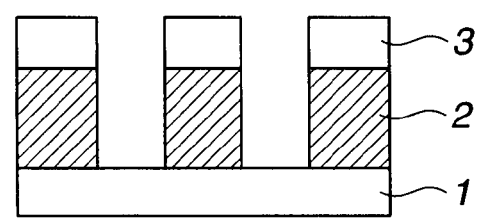

The bilayer resist working process starts with a support substrate 1 overlaid with a processable substrate (or processable film) 2. As shown in FIG. 6A, the undercoat-forming material is applied onto the processable substrate 2 to form an undercoat layer 3, and a photoresist composition, specifically a photoresist composition comprising a silicon atom-containing polymer as a base resin is applied thereon to form a photoresist layer 4. Then a predetermined region 5 of the photoresist layer 4 is exposed to radiation through a photomask (FIG. 6B), baked (PEB), and developed, forming a patterned photoresist layer 4a (FIG. 6C). Thereafter, the undercoat layer 3 is processed by oxygen plasma etching through the patterned photoresist layer 4a as a mask (FIG. 6D). The patterned photoresist layer is removed, and the processable substrate 2 is processed by etching (FIG. 6E).

Figure 7A:
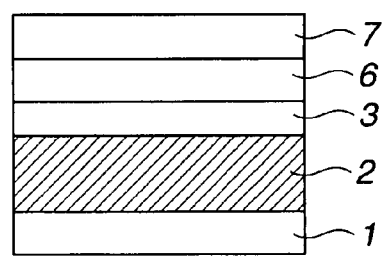
FIG. 7 illustrates steps of a trilayer resist working process.
Figure 7B:
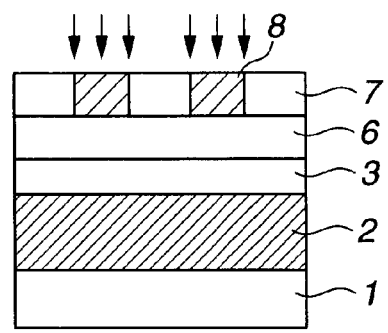
Figure 7C:
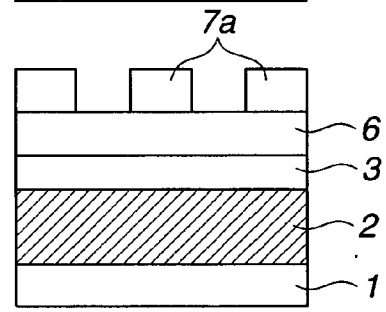
Figure 7D:
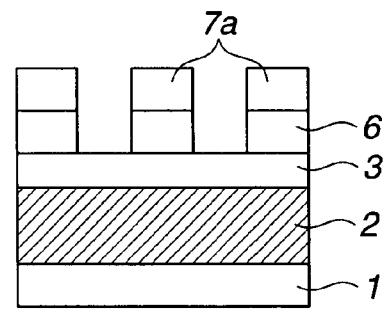
Figure 7E:
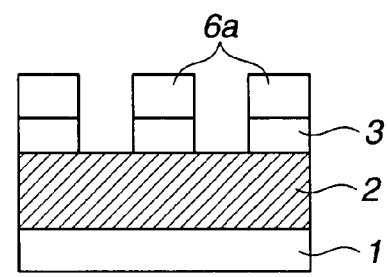
Figure 7F:
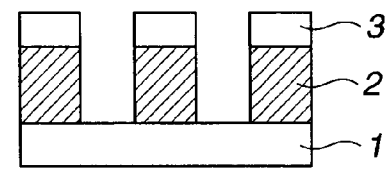

In the trilayer resist working process, an undercoat layer 3 is formed on a processable substrate 2 lying on a support substrate 1 as in the bilayer resist working process, a silicon-containing intermediate layer 6 is formed on the undercoat layer 3, and a single-layer photoresist layer 7 is formed thereon (FIG. 7A). Then a predetermined region 8 of the photoresist layer 7 is exposed to radiation (FIG. 7B), PEB, and developed, forming a patterned photoresist layer 7a (FIG. 7C). The intermediate layer 6 is etched with CF gas through the patterned photoresist layer 7a as a mask (FIG. 7D). The patterned photoresist layer is removed, and the undercoat layer 3 is processed by oxygen plasma etching through the patterned intermediate layer 6a as a mask (FIG. 7E). The patterned intermediate layer 6a is removed, and the processable substrate 2 is processed by etching (FIG. 7F).

EXAMPLE

Synthesis Examples and Examples are given below together with Comparative Examples for further illustrating the invention although the invention is not limited thereby.

The weight average molecular weight (Mw) and number average molecular weight (Mn) of a polymer are determined by gel permeation chromatography (GPC) versus polystyrene standards, and a dispersity (Mw/Mn) is computed therefrom.

Synthesis Example 1

A 300-ml flask as charged with 200 g of Compound 1 shown below, 75 g of 37% formalin, and 5 g of oxalic acid. With stirring, reaction occurred at 100° C. for 24 hours. The reaction solution was poured in 500 ml of methyl isobutyl ketone and thoroughly washed with water to remove the catalyst and metal impurities. The solvent was distilled off under a reduced pressure, and the system was further evacuated to 2 mmHg at 150° C. for removing the water and unreacted monomer, yielding 163 g of Polymer 1.

The polymer was determined for Mw and Mw/Mn by GPC and analyzed for composition by $^1$H-NMR.

Mw=8,000 Mw/Mn=3.20

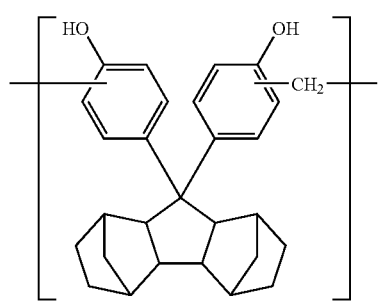

Polymer 1

It is noted that Compounds 1 to 4 were used as the bisphenol compound of formula (1) in Synthesis Example 1 as well as Examples and Comparative Examples to be described later.

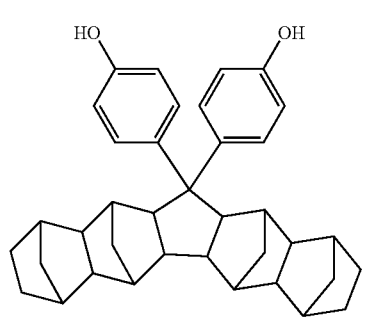

Compound 1

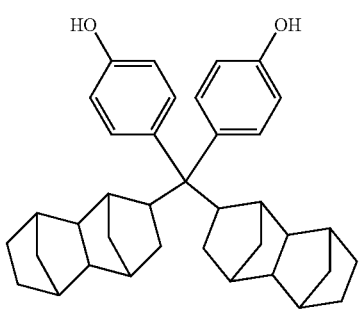

Compound 2

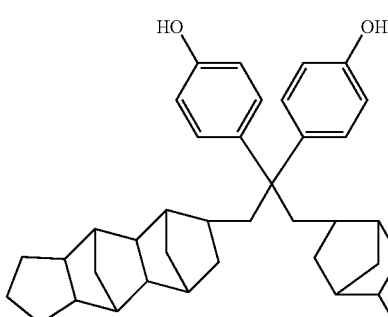

Compound 3

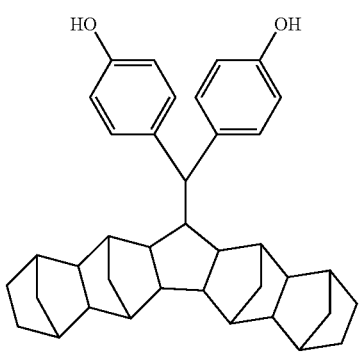

Compound 4

The blending polymers used include Blending Polymer 1 produced by radical polymerization, Blending Polymer 2 produced by cation polymerization, Blending Polymer 3 produced by metathesis catalyzed polymerization, and Blending Polymer 4 which is a novolac resin, the structure of which is shown below together with their molecular weight and dispersity.

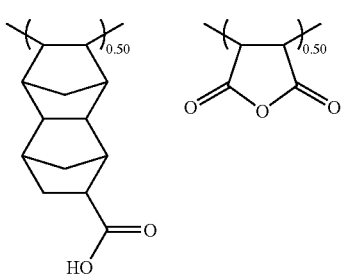

Blending polymer 1

Mw = 4,600
Mw/Mn = 1.45

-continued

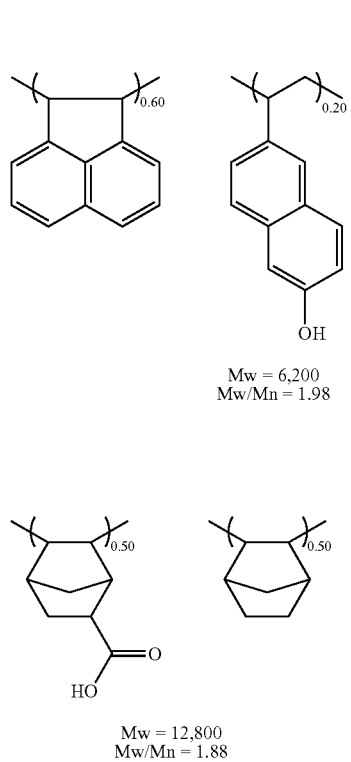

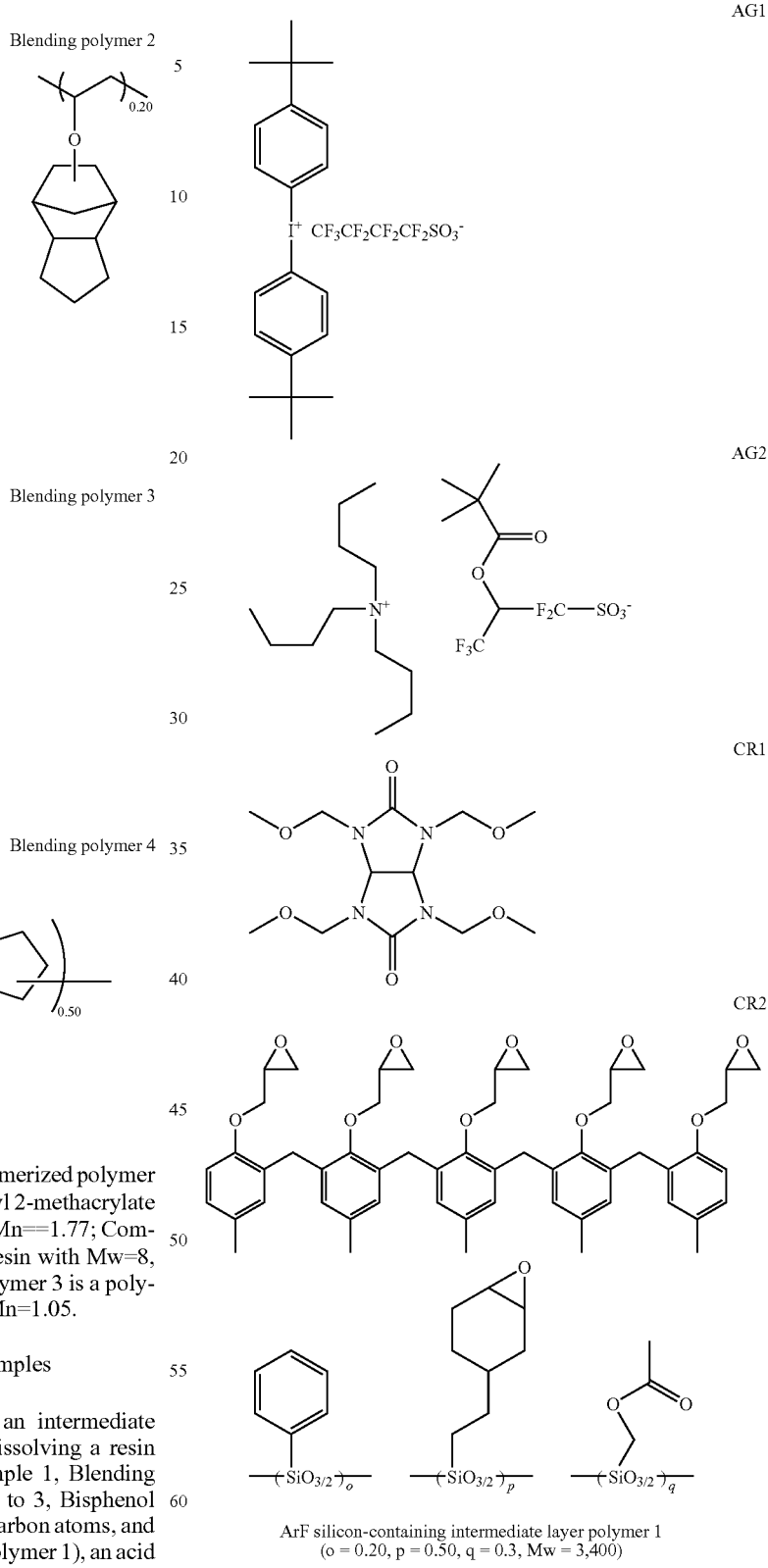

Comparative Polymer 1 is a radically polymerized polymer of 4-hydroxystyrene and 1-anthracenemethyl 2-methacrylate at a ratio 56:44, with Mw=14,400 and Mw/Mn=1.77; Comparative Polymer 2 is a m-cresol novolac resin with Mw=8,800 and Mw/Mn=4.5; and Comparative Polymer 3 is a polyhydroxystyrene with Mw=9,200 and Mw/Mn=1.05.

Examples and Comparative Examples

Undercoat layer-coating solutions and an intermediate layer-coating solution were prepared by dissolving a resin component (Polymer 1 in Synthesis Example 1, Blending Polymers 1 to 4, Comparative Polymers 1 to 3, Bisphenol Compounds 1 to 4 having a group of many carbon atoms, and ArF silicon-containing intermediate layer polymer 1), an acid generator (AG1, 2), and a crosslinker (CR1, 2) in a solvent containing 0.1 wt % of Fluorad FC-430 (3M-Sumitomo Co., Ltd.) according to the formulation shown in Table 1, and passing through a fluoroplastic filter having a pore size of 0.1 μm.

A topcoat resist material was prepared by dissolving a resin, acid generator, and basic compound in a solvent containing 0.1 wt % of Fluorad FC-430 (3M-Sumitomo Co., Ltd.) according to the formulation shown in Table 2, and passing through a fluoroplastic filter having a pore size of 0.1 µm.

Each of the undercoat-forming material solutions was applied onto a silicon substrate and baked at 200° C. for 60 seconds in the case of UDL-1 to 8, 11, Comparative UDL-1 to 3, or at 270° C. for 60 seconds in the case of UDL-9, 10 to form an undercoat layer of 200 nm thick. The intermediate layer-forming material solution was spin coated and baked at 200° C. for 60 seconds to form a silicon-containing intermediate layer (SOG1) of 100 nm thick. Using a variable angle spectroscopic ellipsometer (VASE®) of J. A. Woollam Co., the refractive index (n, k) at wavelength 193 nm of the undercoat layers (UDL-1 to 11, Comparative UDL-1 to 3) or intermediate layer (SOG1) was determined. The results are shown in Table 1.

TABLE 1

| | Polymer (pbw) | Blending polymer (pbw) | Bisphenol compound (pbw) | Crosslinker (pbw) | Acid generator (pbw) | Organic solvent (pbw) | Refractive index @ 193 nm | |
|---|---|---|---|---|---|---|---|---|
| | | | | | | | n | k |
| UDL-1 | — | Blending Polymer 1 (20) | Compound 1 (20) | CR1 (2.0) | AG1 (0.1) | PGMEA (100) | 1.64 | 0.28 |
| UDL-2 | — | Blending Polymer 2 (20) | Compound 1 (20) | CR1 (2.0) | AG1 (0.1) | PGMEA (100) | 1.53 | 0.30 |
| UDL-3 | — | Blending Polymer 3 (20) | Compound 1 (20) | CR1 (2.0) | AG1 (0.1) | PGMEA (100) | 1.56 | 0.29 |
| UDL-3 | — | Blending Polymer 4 (20) | Compound 1 (20) | CR1 (2.0) | AG1 (0.1) | PGMEA (100) | 1.65 | 0.27 |
| UDL-4 | — | Blending Polymer 1 (20) | Compound 2 (10) | CR1 (2.0) | AG1 (0.1) | PGMEA (100) | 1.66 | 0.28 |
| UDL-5 | — | Blending Polymer 1 (20) | Compound 3 (10) | CR1 (2.0) | AG1 (0.1) | PGMEA (100) | 1.67 | 0.27 |
| UDL-6 | — | Blending Polymer 1 (20) | Compound 4 (10) | CR1 (2.0) | AG1 (0.1) | PGMEA (100) | 1.67 | 0.27 |
| UDL-7 | — | Blending Polymer 1 (20) | Compound 4 (10) | CR2 (2.0) | AG1 (0.1) | PGMEA (100) | 1.61 | 0.34 |
| UDL-8 | — | Blending Polymer 1 (20) | Compound 4 (10) | CR1 (2.0) | AG2 (0.1) | PGMEA (100) | 1.67 | 0.27 |
| UDL-9 | — | Blending Polymer 1 (20) | Compound 4 (10) | — | AG2 (0.1) | PGMEA (100) | 1.66 | 0.29 |
| UDL-10 | — | Blending Polymer 1 (20) | Compound 4 (10) | — | — | PGMEA (100) | 1.66 | 0.30 |
| UDL-11 | Polymer 1 (20) | — | — | CR1 (2.0) | AG1 (0.1) | PGMEA (100) | 1.52 | 0.33 |
| SOG1 | ArF silicon-containing intermediate layer polymer 1 (20.0) | — | — | — | AG1 (1) | PGMEA (1000) | 1.66 | 0.15 |
| Comparative UDL-1 | Comparative Polymer 1 (20.0) | — | — | CR1 (2.0) | AG1 (1) | PGMEA (100) | 1.38 | 0.35 |
| Comparative UDL-2 | Comparative Polymer 2 (20.0) | — | — | CR1 (2.0) | AG1 (1) | PGMEA (100) | 1.28 | 0.62 |
| Comparative UDL-3 | Comparative Polymer 3 (20.0) | — | — | CR1 (2.0) | AG1 (1) | PGMEA (100) | 1.62 | 0.58 |

PGMEA: propylene glycol monomethyl ether acetate

TABLE 2

|  | Polymer (pbw) | Acid generator (pbw) | Basic compound (pbw) | Organic solvent (pbw) |
|---|---|---|---|---|
| ArF SL resist | ArF SL resist polymer 1 (100) | PAG1 (2.2) | TMMEA (0.3) | PGMEA (1200) |

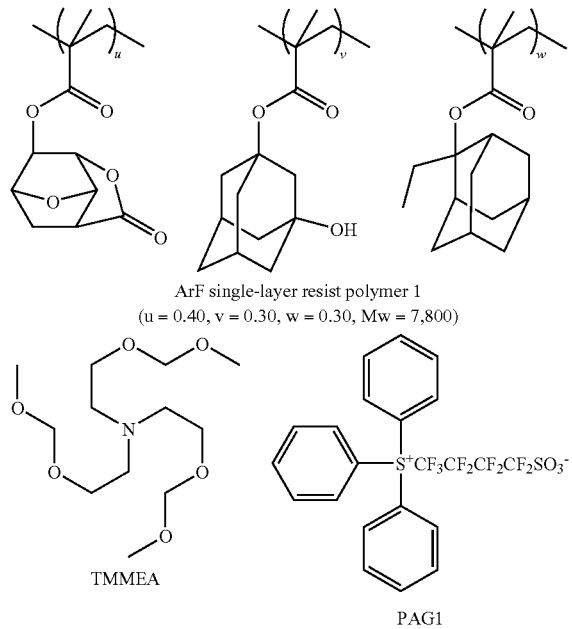

ArF single-layer resist polymer 1
(u = 0.40, v = 0.30, w = 0.30, Mw = 7,800)

TMMEA

PAG1

Each of the undercoat-forming material solutions (UDL-1 to 11, Comparative UDL-1 to 3) was coated onto a $SiO_2$ substrate of 300 nm thick and baked at 200° C. for 60 seconds in the case of UDL-1 to 8, 11 or at 270° C. for 60 seconds in the case of UDL-9, 10 to form an undercoat layer of 200 nm thick. The intermediate layer-forming material solution was coated thereon and baked at 200° C. for 60 seconds to form a silicon-containing intermediate layer (SOG1) of 70 nm thick. Further, the ArF single-layer resist solution was coated thereon and baked at 130° C. for 60 seconds to form a photoresist layer of 150 nm thick.

Thereafter, the resist layer was exposed using an ArF laser stepper S307E (Nikon Corporation, NA 0.85, σ 0.93, 4/5 annular illumination, 6% transmittance half-tone phase shift mask), then baked (PEB) at 110° C. for 60 seconds, and developed for 60 seconds with a 2.38 wt % aqueous solution of tetramethylammonium hydroxide (TMAH), thereby giving a positive pattern. The profile of the 0.08 μm line-and-space pattern was observed. The results are shown in Table 5.

Then, dry etching tests were conducted. There were prepared undercoat layers (UDL-1 to 11, Comparative UDL-1 to 3) as used for the measurement of refractive index. These undercoat layers were examined by a test (1) of etching with $CF_4/CHF_3$ gas using a dry etching instrument TE-8500P by Tokyo Electron, Ltd. A difference in thickness of the undercoat layer or resist before and after the etching test was determined, from which an etching rate was computed. The results are shown in Table 3.

| (1) $CF_4/CHF_3$ gas etching test | |
|---|---|
| Chamber pressure | 40.0 Pa |
| RF power | 1300 W |
| Gap | 9 mm |
| $CHF_3$ gas flow rate | 30 ml/min |
| $CF_4$ gas flow rate | 30 ml/min |
| Ar gas flow rate | 100 ml/min |
| Time | 60 sec |

TABLE 3

| Antireflective coating, resist No. | $CF_4/CHF_3$ gas etching rate (nm/min) |
|---|---|
| UDL-1 | 100 |
| UDL-2 | 93 |
| UDL-3 | 90 |
| UDL-4 | 92 |
| UDL-5 | 82 |
| UDL-6 | 86 |
| UDL-7 | 85 |
| UDL-8 | 86 |
| UDL-9 | 82 |
| UDL-10 | 88 |
| UDL-11 | 80 |
| Comparative UDL-1 | 144 |
| Comparative UDL-2 | 120 |
| Comparative UDL-3 | 129 |

The undercoat layers (UDL-1 to 11, Comparative UDL-1 to 3) were further examined by a test (2) of etching with $Cl_2/BCl_3$ gas using a dry etching instrument L-507D-L by Anelva Corp. A difference in thickness of the polymer layer before and after the etching test was determined, from which an etching rate was computed. The results are shown in Table 4.

| (2) $Cl_2/BCl_3$ gas etching test | |
|---|---|
| Chamber pressure | 40.0 Pa |
| RF power | 300 W |
| Gap | 9 mm |
| $Cl_2$ gas flow rate | 30 ml/min |
| $BCl_3$ gas flow rate | 30 ml/min |
| $CHF_3$ gas flow rate | 100 ml/min |
| $O_2$ gas flow rate | 2 ml/min |
| Time | 60 sec |

TABLE 4

| Antireflective coating, resist No. | $Cl_2/BCl_3$ gas etching rate (nm/min) |
|---|---|
| UDL-1 | 118 |
| UDL-2 | 99 |
| UDL-3 | 96 |
| UDL-4 | 98 |
| UDL-5 | 92 |
| UDL-6 | 98 |
| UDL-7 | 97 |
| UDL-8 | 96 |
| UDL-9 | 97 |
| UDL-10 | 96 |
| UDL-11 | 90 |
| Comparative UDL-1 | 166 |
| Comparative UDL-2 | 132 |
| Comparative UDL-3 | 140 |

The resist pattern resulting from ArF exposure and development was transferred to the SOG film by fluorine gas etching. A set of etching conditions (3) is shown below.

| (3) $CF_4/CHF_3$ gas etching | |
|---|---|
| Chamber pressure | 40.0 Pa |
| RF power | 1000 W |
| Gap | 9 mm |
| $CHF_3$ gas flow rate | 20 ml/min |
| $CF_4$ gas flow rate | 60 ml/min |
| Ar gas flow rate | 200 ml/min |
| Time | 30 sec |

Next, the pattern transferred to the SOG film was transferred to the undercoat layer by oxygen gas etching. A set of etching conditions (4) is shown below.

| (4) Oxygen gas etching | |
|---|---|
| Chamber pressure | 60.0 Pa |
| RF power | 600 W |
| Gap | 9 mm |
| Ar gas flow rate | 40 ml/min |
| $O_2$ gas flow rate | 60 ml/min |
| Time | 20 sec |

Finally, the $SiO_2$ substrate was processed by etching under the above-described conditions (1) while using the undercoat layer pattern as a mask.

A cross section of the pattern was observed under an electron microscope S-4700 (Hitachi, Ltd.). The pattern profile was compared in this way, with the results shown in Table 5.

It is seen from Tables 3 and 4 that when etched with $CF_4/CHF_3$ gas and $Cl_2/BCl_3$ gas, the undercoat layers within the scope of the invention exhibit significantly slower etching rates than Comparative Examples using cresol novolac resin and polyhydroxystyrene. As seen from Table 5, when the undercoat material is applied to the trilayer resist processing, the profile of resist after development, and the profile of undercoat layer after oxygen etching and after substrate processing by etching are satisfactory.

Japanese Patent Application No. 2006-145107 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photoresist undercoat-forming material comprising a resin comprising recurring units derived by novolac formation of a bisphenol compound selected from the group consisting of the following formulae:

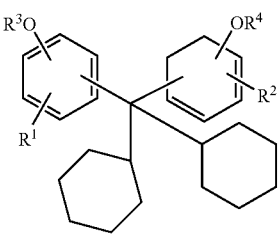

TABLE 5

| | Topcoat resist | Pattern profile after development | SOG profile after transfer etching | Undercoat profile after transfer etching | Substrate profile after transfer etching |
|---|---|---|---|---|---|
| UDL-1 | SL resist for ArF | perpendicular | perpendicular | perpendicular | perpendicular |
| UDL-2 | SL resist for ArF | perpendicular | perpendicular | perpendicular | perpendicular |
| UDL-3 | SL resist for ArF | perpendicular | perpendicular | perpendicular | perpendicular |
| UDL-4 | SL resist for ArF | perpendicular | perpendicular | perpendicular | perpendicular |
| UDL-5 | SL resist for ArF | perpendicular | perpendicular | perpendicular | perpendicular |
| UDL-6 | SL resist for ArF | perpendicular | perpendicular | perpendicular | perpendicular |
| UDL-7 | SL resist for ArF | perpendicular | perpendicular | perpendicular | perpendicular |
| UDL-8 | SL resist for ArF | perpendicular | perpendicular | perpendicular | perpendicular |
| UDL-9 | SL resist for ArF | perpendicular | perpendicular | perpendicular | perpendicular |
| UDL-10 | SL resist for ArF | perpendicular | perpendicular | perpendicular | perpendicular |
| UDL-11 | SL resist for ArF | perpendicular | perpendicular | perpendicular | perpendicular |
| Comparative UDL-1 | SL resist for ArF | perpendicular | perpendicular | perpendicular | tapered and slimmed |
| Comparative UDL-2 | SL resist for ArF | perpendicular | perpendicular | perpendicular | tapered |
| Comparative UDL-3 | SL resist for ArF | perpendicular | perpendicular | perpendicular | tapered |

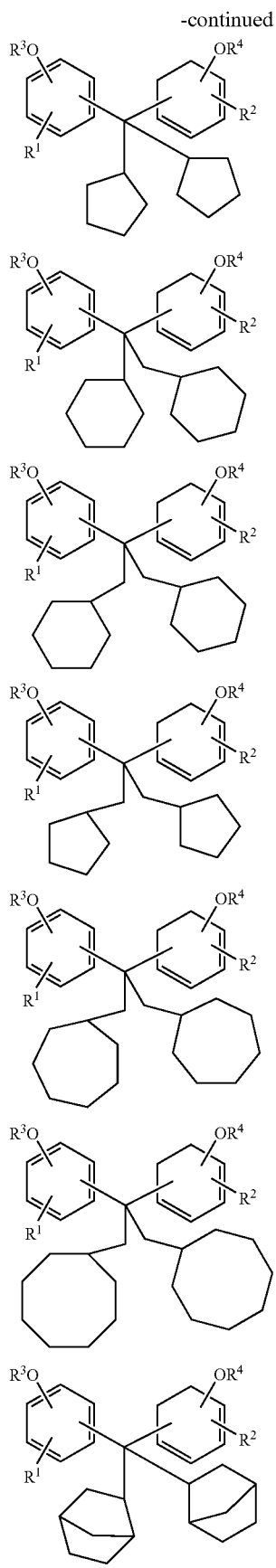
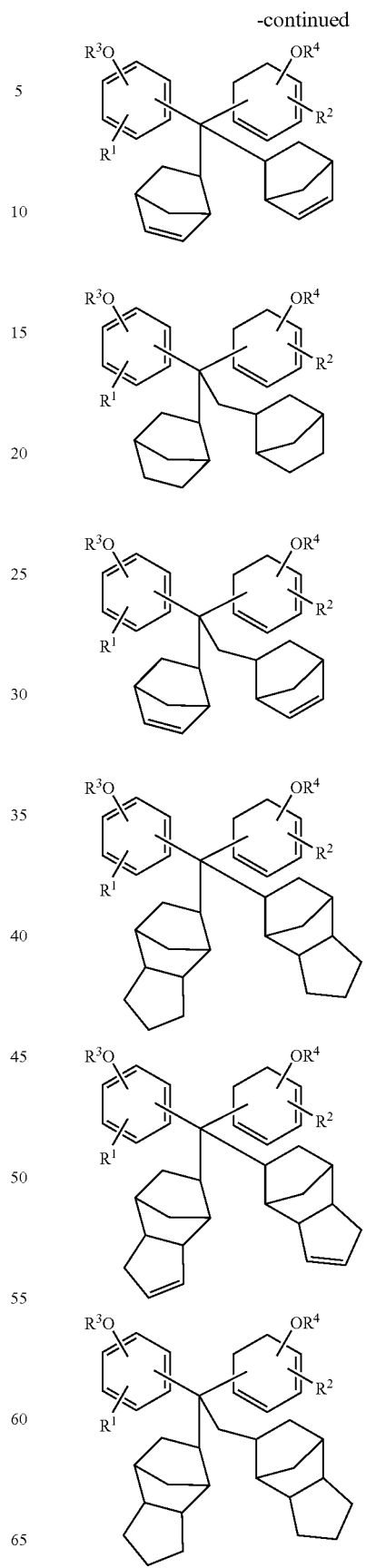

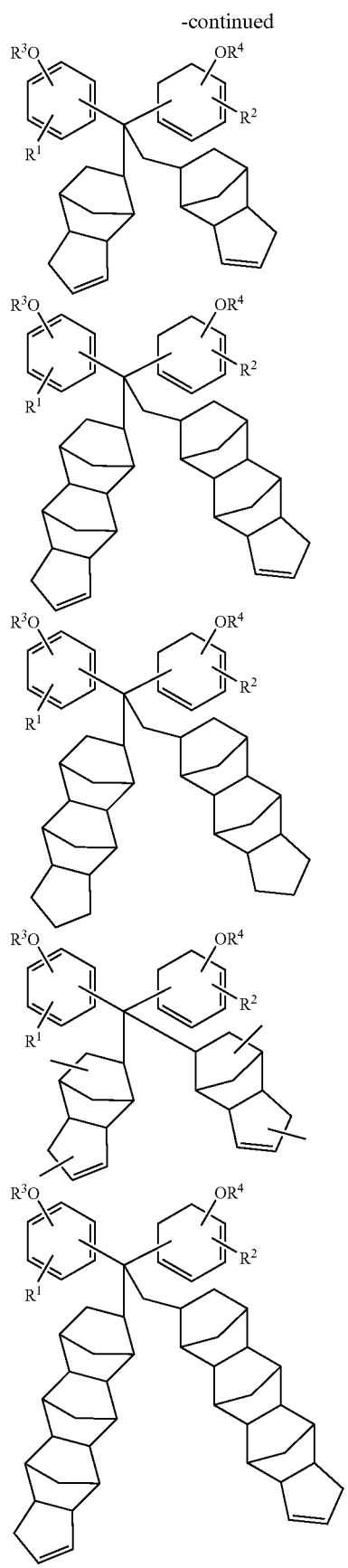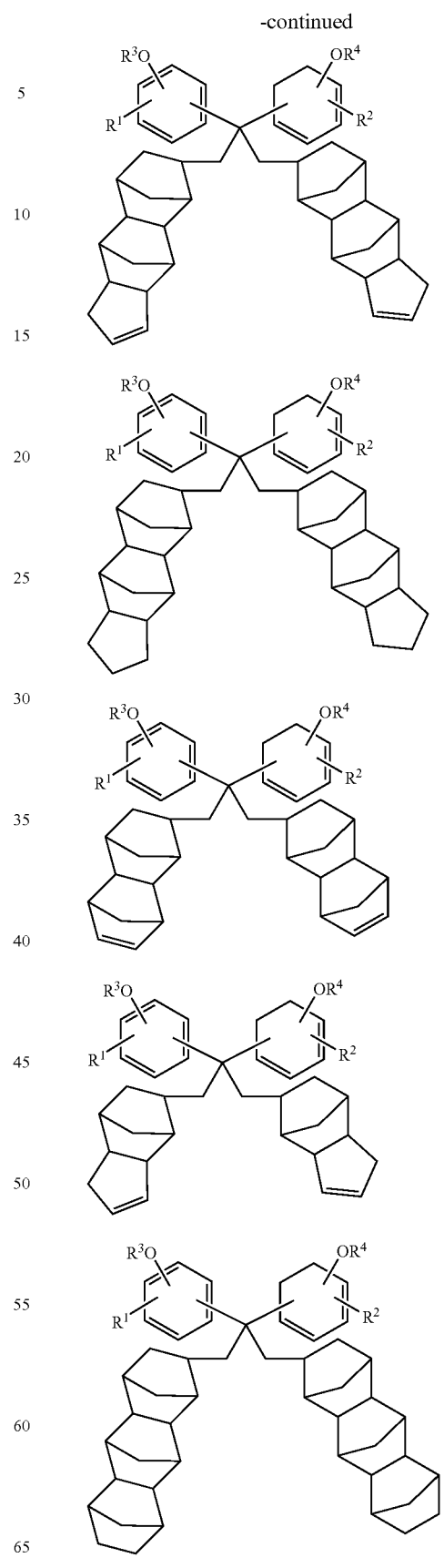

-continued
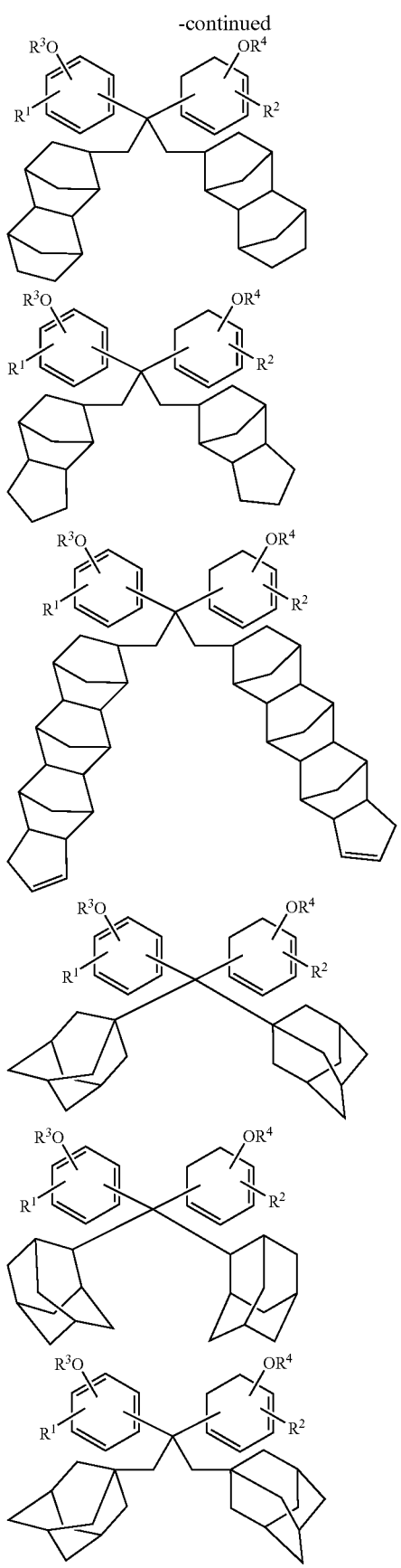
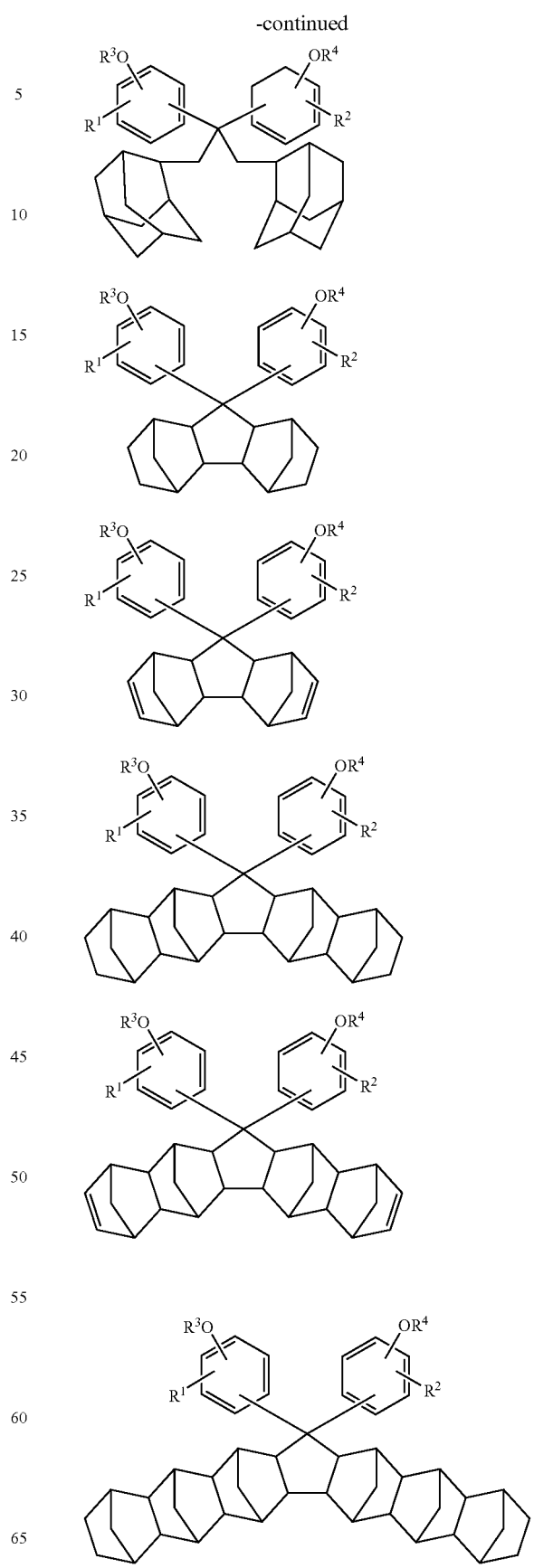

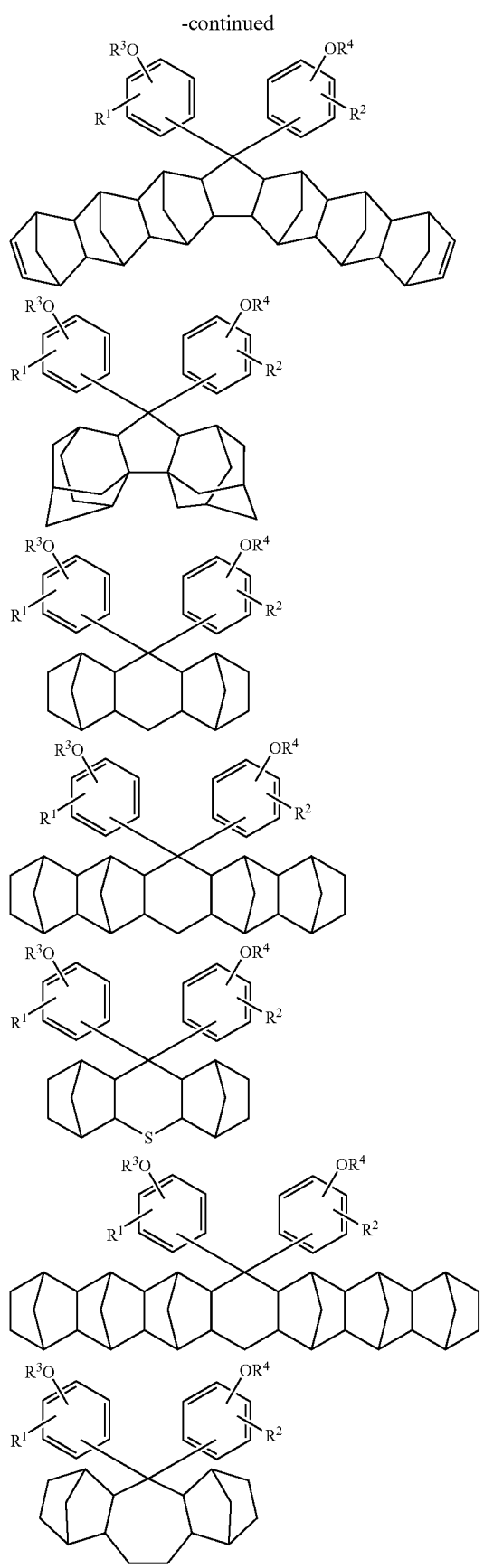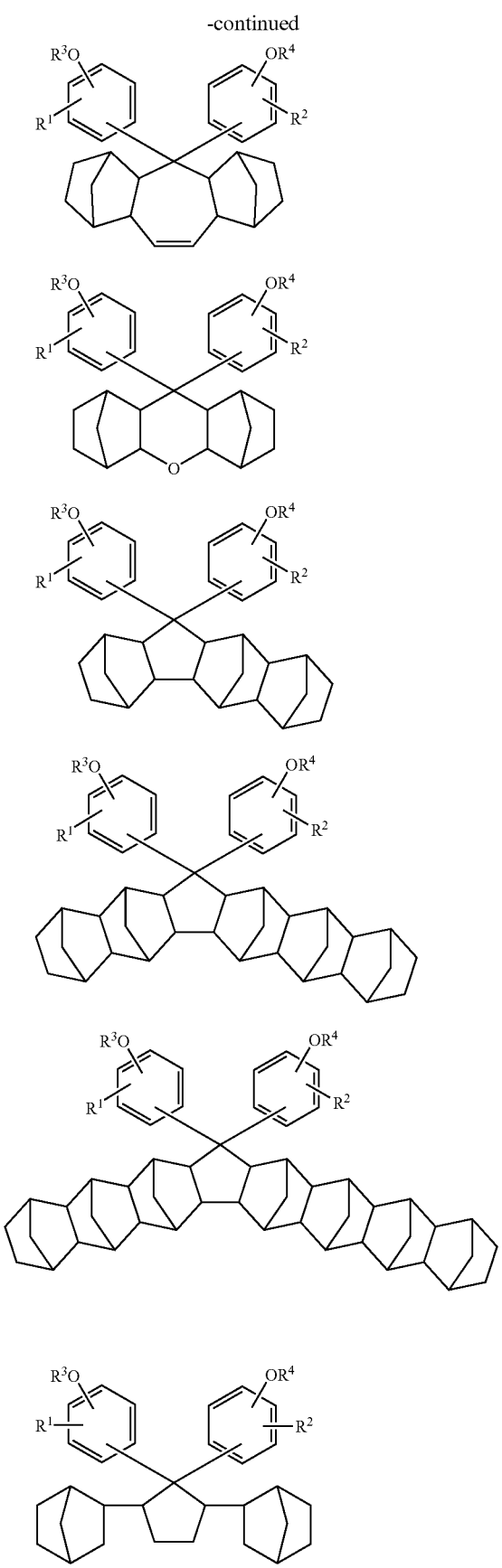

-continued
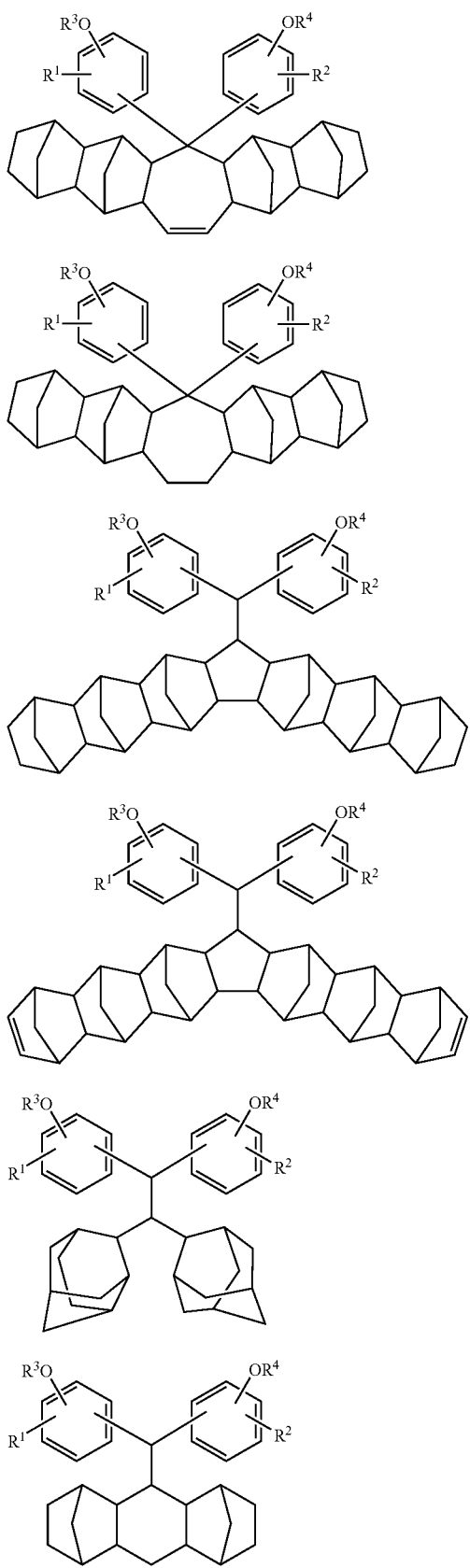
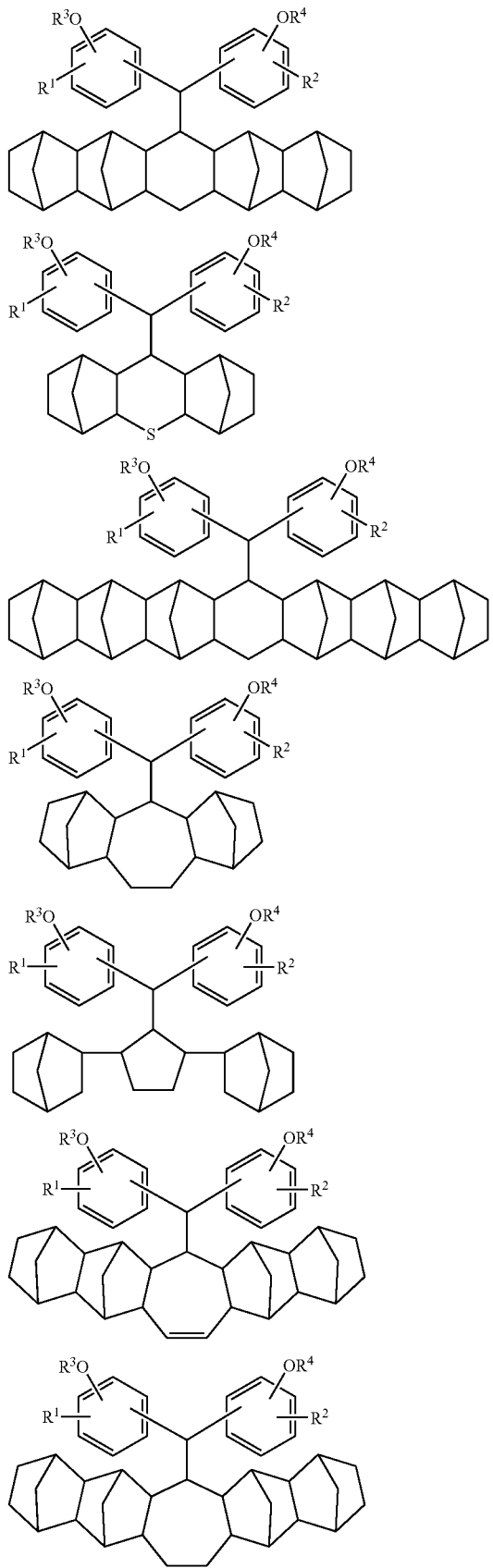

-continued

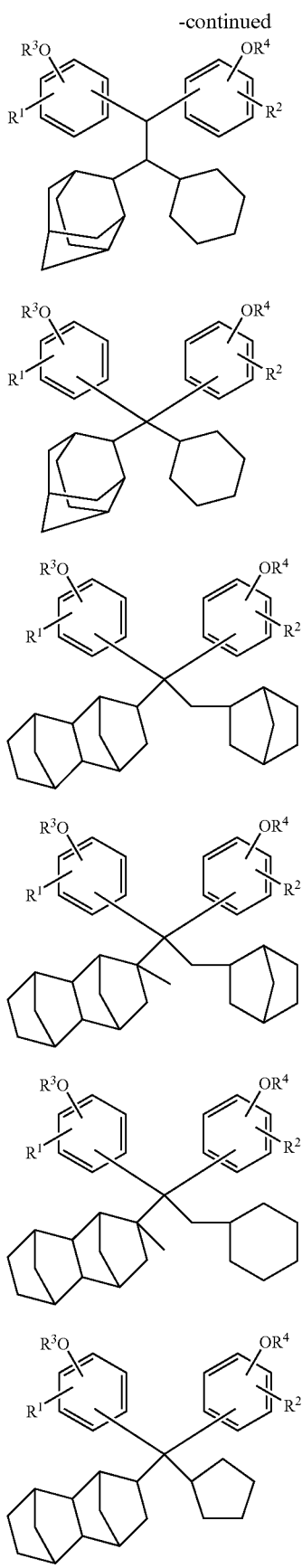

-continued

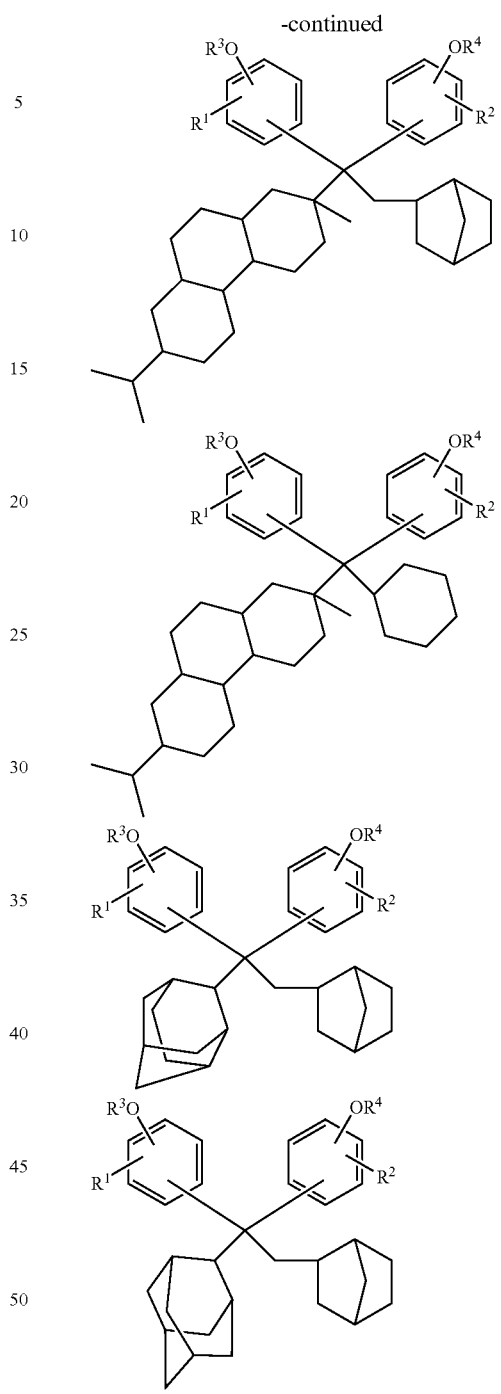

wherein $R^1$ and $R^2$ are each independently hydrogen, a straight, branched or cyclic $C_1$-$C_{10}$ alkyl group, $C_6$-$C_{10}$ aryl group or $C_2$-$C_{10}$ alkenyl group, $R^3$ and $R^4$ are each independently hydrogen, a straight, branched or cyclic $C_1$-$C_6$ alkyl group, straight, branched or cyclic $C_2$-$C_6$ alkenyl group, $C_6$-$C_{10}$ aryl group, $C_2$-$C_6$ acetal group, $C_2$-$C_6$ acyl group or glycidyl group.

2. The material of claim 1, further comprising an organic solvent.

3. The material of claim 1, further comprising a crosslinker and an acid generator.

4. A patterning process comprising the steps of:
applying the photoresist undercoat-forming material of claim 1 onto a processable substrate to form an undercoat layer,
applying a photoresist composition onto the undercoat layer to form a photoresist layer,
exposing the photoresist layer in a predetermined region to radiation,
developing the photoresist layer with a developer to form a photoresist pattern, and
processing the undercoat layer and the substrate through the patterned photoresist layer as a mask, by means of a dry etching apparatus.

5. The patterning process of claim 4, wherein said photoresist composition comprises a silicon atom-containing polymer, and the processing step includes dry etching the undercoat layer through the photoresist layer as a mask with an oxygen-based etchant gas.

6. A patterning process comprising the steps of:
applying the photoresist undercoat-forming material of claim 2 onto a processable substrate to form an undercoat layer,
applying a silicon atom-containing intermediate layer over the undercoat layer,
applying a photoresist composition onto the intermediate layer to form a photoresist layer,
exposing the photoresist layer in a predetermined region to radiation,
developing the photoresist layer with a developer to form a photoresist pattern,
processing the intermediate layer through the patterned photoresist layer as a mask,
removing the patterned photoresist layer, and
processing the undercoat layer and then the substrate through the processed intermediate layer as a mask,
the processing steps using a dry etching apparatus.

7. The patterning process of claim 6, wherein said photoresist composition comprises a silicon atom-free polymer, and the step of processing the undercoat layer includes dry etching with an oxygen-based etchant gas.

* * * * *